United States Patent
Yap et al.

(10) Patent No.: US 9,726,818 B1
(45) Date of Patent: Aug. 8, 2017

(54) MULTI-WAVELENGTH BAND OPTICAL PHASE AND AMPLITUDE CONTROLLER

(71) Applicant: HRL LABORATORIES LLC, Malibu, CA (US)

(72) Inventors: Daniel Yap, Newbury Park, CA (US); Troy Rockwood, Thousand Oaks, CA (US); Kevin Geary, Los Angeles, CA (US); Sarabjit Mehta, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/290,979

(22) Filed: May 29, 2014

Related U.S. Application Data

(60) Provisional application No. 61/829,194, filed on May 30, 2013.

(51) Int. Cl.
*G02F 1/035* (2006.01)
*G02B 6/10* (2006.01)
(Continued)

(52) U.S. Cl.
CPC ............ *G02B 6/10* (2013.01); *G02F 1/0147* (2013.01); *G02F 1/025* (2013.01)

(58) Field of Classification Search
CPC ...... G02F 1/025; G02F 1/2257; G02F 1/0147; G02F 1/218; G02F 1/3133; G02F 1/3138;
(Continued)

(56) References Cited

U.S. PATENT DOCUMENTS

| | | | | |
|---|---|---|---|---|
| 5,138,626 A | * | 8/1992 | Yap | B82Y 20/00 372/45.01 |
| 5,796,881 A | | 8/1998 | Manasson et al. | |

(Continued)

OTHER PUBLICATIONS

A. Hosseini, D. Kwong, Y. Zhao, Y.-S. Chen, F. Crnogorac, R.F.W. Pease, and R T. Chen, "Unequally spaced waveguide arrays for silicon nanomembrane-based efficient large angle optical beam steering," IEEE J. Selected Topics in Quantum Electronics, vol. 15, No. 5, pp. 1439-1446, 2009.

(Continued)

*Primary Examiner* — Kaveh C Kianni
*Assistant Examiner* — Hung Lam
(74) *Attorney, Agent, or Firm* — Ladas & Parry

(57) ABSTRACT

A photonic waveguide for conducting light having first and second wavelengths, the waveguide comprising superposed first and second strips of light conducting semiconductor materials having first and second refractive indexes, wherein the second wavelength is shorter than the first wavelength and the second refractive index is higher than the first refractive index, wherein the width and height of the first strip of light conducting semiconductor material are such that the first strip of light conducting semiconductor material is adapted to confine an optical mode of the first wavelength and the width and height of the second strip of light conducting semiconductor material are such that the second strip of light conducting semiconductor material is adapted to confine an optical mode of the second wavelength but is too narrow to confine an optical mode of the first wavelength.

25 Claims, 16 Drawing Sheets

(51) Int. Cl.
*G02F 1/01* (2006.01)
*G02F 1/025* (2006.01)

(58) Field of Classification Search
CPC ..... G02B 6/12; G02B 6/10; G02B 2006/12097
USPC ............. 385/2, 3, 8, 129–132; 372/7, 43.01, 372/45.01, 50.1–50.21
See application file for complete search history.

(56) References Cited

U.S. PATENT DOCUMENTS

| | | | |
|---|---|---|---|
| 5,943,159 A | 8/1999 | Zhu | |
| 6,195,373 B1* | 2/2001 | Fukunaga | H01S 5/20 372/45.01 |
| 6,393,185 B1* | 5/2002 | Deacon | G02B 6/12004 385/12 |
| 8,344,503 B2 | 1/2013 | Sanders et al. | |
| 8,451,872 B2* | 5/2013 | Arimoto | G02F 1/3133 372/102 |
| 2009/0103875 A1* | 4/2009 | Shimizu | G02B 6/1221 385/131 |
| 2009/0302435 A1 | 12/2009 | Pagaila et al. | |
| 2010/0127345 A1 | 5/2010 | Sanders et al. | |

OTHER PUBLICATIONS

A. W. Topol, et al., "Enabling technologies for wafer-level bonding of 3D MEMS and integrated circuit structures," Proceedings 54th Electronic Components and Technology Conference, pp. 931-398, 2004.
B. D. Steinberg, Principles of Aperture and Array System Design, Wiley-Interscience, New York, 1976.
C. A. Balanis, Antenna Theory: Analysis and Design, 2nd edition, Wiley, New York, Sections 3.6, 6.10, 12.2, and 12.3, 1997.
D. Kwong, A. Hosseini, Y. Zhang, and R.T. Chen, "1 x 12 Unequally spaced waveguide array for actively tuned optical phased array on a silicon nanomembrane," Applied Physics Letters, vol. 99, 051104, 2011.
D. Kwong, Y. Zhang, A. Hosseini and RT. Chen, "Integrated optical phased array based large angle beam steering system fabricated on silicon-on-insulator," Proceedings SPIE vol. 7943, p. 79430Y, 2011.
F. Vasey, F. K. Reinhart, R Houdre, and J. M. Stauffer, "Spatial optical beam steering with an AlCaAs integrated phased array," Appl. Opt. 32, pp. 3220-3232, 1993.
J. A. Burns, et al., "A wafer-scale 3-D circuit integration technology," IEEE Trans. Electron Devices, vol. 53, pp. 2507-2516, 2006.
J. A. McCaulley, V. M. Donnelly, M. Vernon and I. Taha, "Temperature dependence of the near-infrared refractive index of silicon, gallium arsenide, and indium phosphide," Physical Review B, vol. 49, pp. 7408-7417, 1994.
J. E. Peters, P. D. Ownby, C. R Poznich, J. C. Richter and D. W. Thomas, "Infrared absorption of Czochralski germanium and silicon," Proceedings SPIE vol. 4452, pp. 17-24, 2001.
U.S. Appl. No. 14/290,983, filed May 30, 2014, Yap et al.
U.S. Appl. No. 14/290,986, filed May 30, 2014, Yap et al.
U.S. Appl. No. 61/829,194, filed May 30, 2013, Yap et al.
J. H. Abeles and R J. Deri, "Suppression of sidelobes in the far-field radiation patterns of optical waveguide arrays," Applied Physics Letters, vol. 53, pp. 1375-1377, 1988.
J. J. McMahon, E. Chan, S. H. Lee, R. J. Gutmann and J.-Q. Lu, "Bonding interfaces in wafer-level metal/adhesive bonded 3D integration," Proc. 2008 Electronic Components and Technology Conference, pp. 871-878, 2008.
L. Schulwitz and A. Mortazawi, "A Tray Based Rotman Lens Array with Beamforming in Two Dimensions for Millimter-Wave Radar," IEEE Intl. Symposium on Phased Array Systems and Technology (ARRAY), pp. 850-853, Oct. 2010.
M. Jarrahi, R F. W. Pease, D. A. B. Miller and T. H. Lee, "High-speed optical beam-steering based on phased-array waveguides," J. Vacuum Science and Technology B, vol. 26, p. 2124-2126, 2008.
P. Enquist, "Scalable direct bond technology and applications driving adoption," 2011 IEEE Intl. 3D System Integration Conference (3DIC), p. P-1-6, 2012.
P. Enquist, et al., "Low cost of ownership scalable copper direct bond interconnect 3D IC technology for three dimensional integrated circuit applications," 2009 IEEE Intl. Conf. on 3D System Integration, 2009.
P.F. McManamon, T.A. Dorschner, D.C. Corkum, L.J. Friedman, D.S. Hobbs, M.K.O. Holz, S. Liberman, H. Nguyen, D.P. Resler, RC. Sharp, and E.A. Watson, "Optical phased array technology," Proceedings of IEEE, vol. 84, No. 2, pp. 268-298, 1996.
R J. Mailloux, Phased Array Antenna Handbook. Artech House, Boston, 1994, pp. 468-471.
T.E. Dillon, C.A. Schuetz, RD. Martin, D.C. Mackrides, P.F. Curt, J. Bonnet, and D.W. Prather, "Nonmechanical Beam Steering Using Optical Phased Arrays," Proc. of SPIE, vol. 8184, 81840F, pp. 1-11, 2011.
W. Peng, et al., "Single-crystal silicon/silicon dioxide multilayer heterostructures based on nanomembrane transfer", Applied Physics Letters, vol. 90, pp. 183107-1-183107-3.
From U.S. Appl. No. 14/290,983, Application and Office Actions.
From U.S. Appl. No. 14/290,986, Application and Office Actions.
From U.S. Appl. No. 61/829,194, Application.
From U.S. Appl. No. 14/290,983 (Unpublished, Non-Publication Requested), Restriction/Election mailed on Jan. 6, 2016.
From U.S. Appl. No. 14/290,983 (Unpublished, Non-Publication Requested), Non-Final Rejection mailed on Mar. 31, 2016.
From U.S. Appl. No. 14/290,986 (Unpublished, Non-Publication Requested), Non-Final Rejection mailed on Mar. 23, 2016.

* cited by examiner

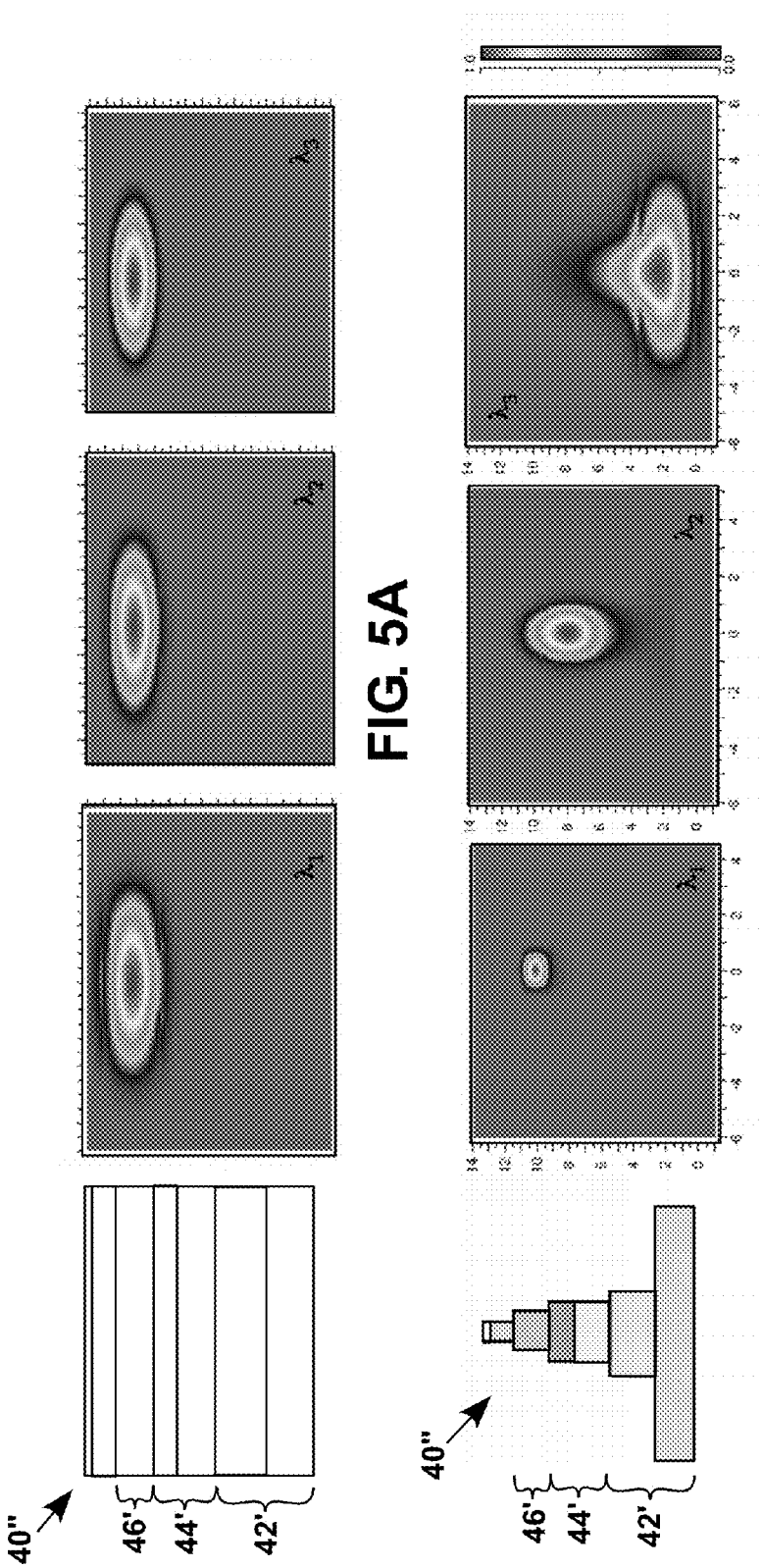

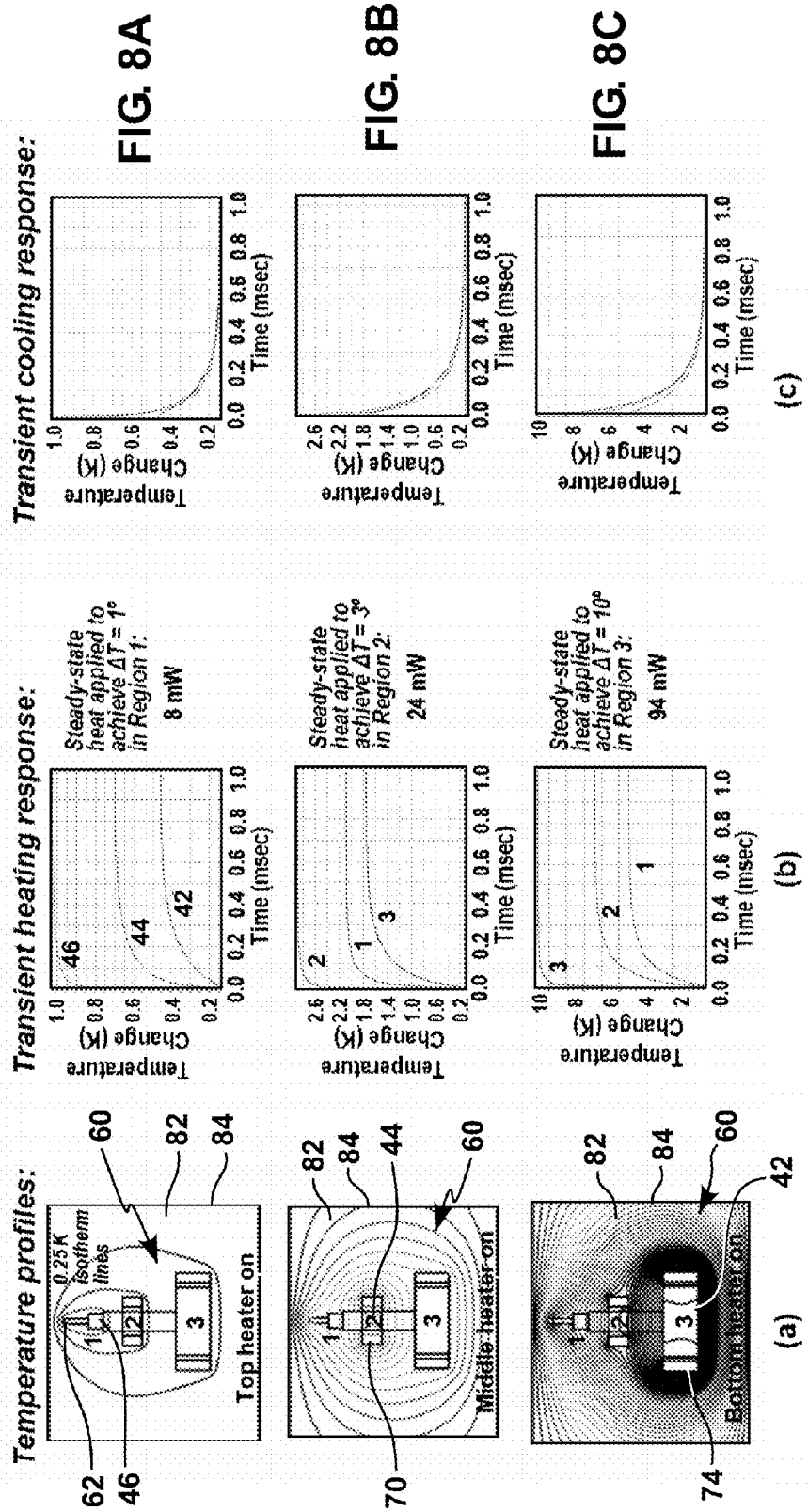

MULTI-WAVELENGTH BAND OPTICAL PHASE AND AMPLITUDE CONTROLLER

CROSS REFERENCE TO RELATED APPLICATIONS

The present disclosure claims priority of U.S. provisional application No. 61/829,194, filed on May 30, 2013 and entitled "MULTI-WAVELENGTH OPTICAL BEAM FORMER", which is hereby incorporated by reference.

REFERENCE TO A CONTRACT

This disclosure relates to work performed under Government contract No. N00014-13-C-0036; entitled "MULTI-BAND OPTICAL PHASED ARRAY BEAM FORMER".

INCORPORATION BY REFERENCE

The present disclosure relates to co-pending U.S. patent Ser. No. 14/290,986, filed on May 29, 2014 and entitled: "MULTI-SLICE TWO-DIMENSIONAL BEAM FORMER ASSEMBLY", which is hereby incorporated by reference.

The present disclosure relates to co-pending U.S. patent Ser. No. 14/290,983, filed on May 29, 2014 and entitled: "A PSEUDO-RANDOMLY SPACED TWO-DIMENSIONAL PHASED ARRAY ASSEMBLY", which is hereby incorporated by reference.

TECHNICAL FIELD

The present disclosure relates to structures that allows for modifying the phase and/or amplitude of light comprising multiple wavelengths. The present disclosure also relates to the use of such structures to make mono-dimensional or bi-dimensional optical phased array assemblies capable of simultaneously forming and steering optical beams comprising multiple wavelengths.

BACKGROUND

An optical phased array or beam former comprises a plurality of light sources arranged in an array and provides for controlling the direction of a beam of light that is formed by the light emitted from the plurality of light sources, by controlling the phase of the light from each light source. Alternatively, an optical phased array can also provide for receiving light from a controlled direction by controlling the phase of the light received on each light receiver of an array of receivers.

Known 2-D optical phased array control the phase of light waves transmitted by, or reflected from, a two-dimensional surface by means of adjustable surface elements. By for example dynamically controlling the optical properties of a surface on a microscopic scale, it is possible to steer the direction of light beams, or the view direction of sensors, without any moving parts. Phased array beam steering can be used for optical switching and multiplexing in optoelectronic devices, and for aiming laser beams on a macroscopic scale. A two-dimensional optical phased array or beam former can for example be used in an infra-red counter measures (IRCM) system, for directing a high-power beam of light at the optical aperture of a threat to dazzle and jam its optical seekers. Optical phased arrays can therefore improve the survivability of military and commercial platforms under attack from threat munitions and missiles that may be guided by a variety of electro-optic (EO) and infrared (IR) seeker types, such as semi-active laser (SAL) designator sensors and EO/IR imagers that sense one or multiple wavelength bands, with these seekers often sharing the same optical aperture. For at least these reasons, two-dimensional optical phased arrays are of interest to providers of military and commercial aircraft, as well as to any commercial developer of IRCM systems for military and civilian applications.

A two-dimensional optical phased array can also be used in compact laser radar systems or in LIDARs. Such systems can be used as altimeters for aircraft (including rotorcraft). Such systems also are envisioned for some automobiles. An advantage of a phased array is its large field of regard and fast beam steering, which means that one phased array can take the place of 4 to 10 or more small mechanical or micro-electro-mechanical (MEM) beam steerers.

The publication "Spatial optical beam steering with an AlGaAs integrated phased array," (Applied Optics, vol. 32, pp. 3220-3232, 1993, by F. Vasey, F. K. Reinhart, R. Houdré, and J. M. Stauffer) describes a beam steering approach based on the use of integrated AlGaAs waveguide arrays on a GaAs substrate, in which each array element is a tunable phase shifter. The phase tuning is achieved via a linear electro-optic effect in the material by forming a heterojunction barrier with a low resistivity transparent conductor (indium-tin-oxide) cladding layer. Diffraction gratings patterned by electron-beam lithography couple light into and out of the device. Phasing is achieved electro-optically with voltages applied through indium tin oxide/AlGaAs Shottky junctions. Discrete beam steering was demonstrated with a 43-element rib waveguide array at an 850-nm wavelength. A sawtooth electrode kept the device length short and the electrode surface small. Continuous deflection over a ±7.2 mrad range at a 900-nm wavelength was reported. A set of seven sawtooth and offset electrodes allowed addressing of points within this range. The beam had a width of 1.5 mrad, and the maximum modulation voltage is −8.5 V.

A problem with this approach is the rather limited phase delay achievable with the described tunable waveguides due to the weak electro-optic effect of AlGaAs. Another problem with this approach is that waveguide lengths of more than 3 mm and large control voltages (7.2 volts) are required just to steer the output beam by 10 mrad at 0.85 μm wavelength. The waveguides in the array have a spacing of 12 μm, which is 14 times larger than the wavelength of the light. Thus, the far-field pattern generated with this approach has prominent grating lobes.

As taught in the publication "Suppression of sidelobes in the far-field radiation patterns of optical waveguide arrays", by J. H. Abeles and R. J. Deri (Applied Physics Letters, vol. 53, pp. 1375-1377, 1988), it is possible to avoid producing grating lobes by using non-uniform spacing between the emitters of the array.

The publications: "Integrated optical phased array based large angle beam steering system fabricated on silicon-on-insulator,", by D. Kwong, Y. Zhang, A. Hosseini and R. T. Chen (Proceedings SPIE Vol. 7943, p. 79430Y, 2011) and "1×12 Unequally spaced waveguide array for actively tuned optical phased array on a silicon nanomembrane" by D. Kwong, A. Hosseini, Y. Zhang, and R. T. Chen (Applied Physics Letters, Vol. 99, 051104, 2011), disclose an optical 1-D phased array with non-uniform emitter spacing that uses thermo-optic phase shifters fabricated in silicon waveguides (a thermal dependency of the Refractive Index is called the thermo-optic effect).

FIG. 1 shows such an optical 1D phased array 10 with non-uniform emitter spacing, which uses a plurality 12 of substantially parallel thermo-optic phase shifters fabricated in silicon waveguides. Each thermo optic phase shifter comprises a thermo-optic section 13 having a heater element with a control pad 14. All of the thermo optic phase shifters 13 of the plurality 12 receive their light from a single light input 16 through a coupler section 18. The output of the thermo-optic section 13 of each phase shifter is coupled to an S-bend passive phase shifter section 20 that allows positioning the outputs of the phase shifters with a spacing selected to form a non-uniform array of outputs 22, to ensure that the grating lobes associated with those sub-arrays occur at different angles.

FIG. 2 shows in detail the layout of the plurality 12 of phase shifters 13 of FIG. 1 (without showing the control pads 14). Thermo-optic phase shifters 13 have each a length of substantially 0.5 mm and can tune the phase shifts over 0-2 π. The time needed for switching the phase between 0 and π is less than 10 μsec for these compact silicon waveguides. A metal heater strip (not shown) placed above the waveguide is used to change the temperature of the waveguide. The array shown in FIGS. 1 and 2 allows steering a 1.55 μm wavelength output beam by 30° while applying a power of 21 mW per waveguide channel, for an array having 12 separately controlled waveguide channels.

FIG. 3 is a photograph showing a cross section of one thermo-optic phase shifter 13 of the array of FIGS. 1 and 2. Thermo-optic phase shifter 13 comprises a silicon waveguide 24 formed on top of a SiO2 layer/box 27, at the bottom of a trench 26 cut through a PECVD SiO2 layer 28 formed on top of SiO2 layer 27. A PECVD SiO2 plug 30, formed on top of silicon waveguide 24 such that the edges of plug 30 are isolated from the edges of trench 26 by air gaps 32, is covered by a heater 34, for example a strip of Cu/Au. SiO2 layers 27 and 28 can comprise air regions (not shown) surrounding each thermo-optic phase shifter 13, to isolate them thermally from each other.

It is noted that the array illustrated in FIGS. 1 and 2 actually comprises several sub-arrays for which the element-to-element spacing within each sub-array is uniform. On another hand, the different sub-arrays have different element-to-element spacing that are selected to ensure that the grating lobes associated with those sub-arrays occur at different angles.

It is also known to have, alternatively to phase shifters using thermo-optic materials, phase shifters using electro-optic materials. Such phase shifters can use optical waveguides fabricated from GaAs/AlGaAs materials and make use of the quantum confined Stark effect (QCSE) in a multiple quantum well (MQW) structure to achieve a stronger voltage-controlled phase modulation. For example, with a phase-shift section length of 1.5 mm, a voltage change of approximately 4 Volts is needed to change the phase by 2π for 0.87 μm wavelength light.

The inventors have noted that all of the known phased arrays use optical phase shifters capable to operate at only one wavelength at a time. However, there exists a need for an optical phased array capable of simultaneously emitting or receiving directional light beams having different wavelengths.

SUMMARY OF THE INVENTION

The present invention relates to the elements of an optical phased array capable of simultaneously emitting or receiving directional light beams having different wavelengths.

In particular, the present disclosure relates to a photonic waveguide capable of conducting simultaneously light of at least two different wavelengths; to an optical phase shifter capable of controllably shifting the phase of the light of at least one of the at least two different wavelengths; to a coupler capable of controllably coupling the light of each wavelength from two photonic waveguides; to a light emitter capable of emitting the light of the at least two different wavelengths in the photonic waveguide; and to the combinations of these elements that allow forming an optical phased array.

An embodiment of the present disclosure relates to a photonic waveguide for conducting light having a first wavelength and light having a second wavelength, the waveguide comprising superposed first and second strips of light conducting semiconductor materials having first and second refractive indexes, wherein the second wavelength is shorter than the first wavelength and the second refractive index is higher than the first refractive index, wherein the width and height of the first strip of light conducting semiconductor material are such that the first strip of light conducting semiconductor material is adapted to confine an optical mode of the first wavelength and the width and height of the second strip of light conducting semiconductor material are such that the second strip of light conducting semiconductor material is adapted to confine an optical mode of the second wavelength but is too narrow to confine an optical mode of the first wavelength.

According to an embodiment of the present disclosure the photonic waveguide comprises, between the first and second strips of light conducting semiconductor materials, an intermediate strip of light conducting semiconductor material having a refractive index comprised between the first and second refractive indexes, and having a width and a height such that the intermediate strip of light conducting semiconductor material is too narrow to confine an optical mode of the first wavelength.

An embodiment of the present disclosure relates to an optical input waveguide, having an input section for receiving light having said first and second wavelengths and having an output section coupled to a photonic waveguide according to the present disclosure, the optical input waveguide comprising superposed first and second strips of light conducting semiconductor materials of the same materials as the photonic waveguide; wherein: in the input section, the width and height of the second strip of light conducting semiconductor material are such that the second strip of light conducting semiconductor material is adapted to confine an optical mode of the first wavelength as well as an optical mode of the second wavelength; and in the output section, the width and height of the superposed first and second strips of light conducting semiconductor materials are the same as those of the superposed first and second strips of light conducting semiconductor materials of the photonic waveguide; wherein the width and height of the second strip of light conducting semiconductor material change gradually from the input section to the output section of the optical input waveguide.

An embodiment of the present disclosure relates to an optical phase shifter comprising a photonic waveguide according to the present disclosure, wherein at least one of the first and second strips of light conducting semiconductor material comprises a layer of electro-optic material; the phase shifter further comprising a pair of phase-control electrodes arranged for applying a control voltage to the electro-optic material.

According to an embodiment of the present disclosure, the first and second strips of light conducting semiconductor materials comprise each a layer of electro-optic material; the phase shifter further comprising first and second pairs of phase-control electrodes respectively arranged for applying a control voltage to the electro-optic material of the first and second strips of light conducting semiconductor materials.

According to an embodiment of the present disclosure, said layers of electro-optic material of the first and second strips of light conducting semiconductor materials comprise each a layer of undoped or unintentionally doped material; the first and second strips of light conducting semiconductor materials further comprising layers of N and/or P-doped materials such that said layers of undoped or unintentionally doped material form the central portions of PIN diodes in opposing series, and said layers of N or P-doped material the P and N portions of said PIN diodes; said phase-control electrodes being in contact with said layers of N or P-doped materials for applying said control voltage to said PIN diodes.

An embodiment of the present disclosure relates to an optical coupler comprising first and second photonic waveguides according to the present disclosure; wherein: end portions of the first strip of light conducting semiconductor materials of the first and second photonic waveguides join laterally to form respectively first and second sides of a first end of a first strip of light conducting semiconductor material of a coupling portion; corresponding end portions of the second strip of light conducting semiconductor materials of the first and second photonic waveguides join laterally to form respectively first and second sides of a first end of a second strip of light conducting semiconductor material of the coupling portion; and the first and second strips of light conducting semiconductor materials of the coupling portion respectively comprise first and second layers of electro-optic materials; the optical coupler further comprising: first and second pairs of coupling-control electrodes arranged for applying a control voltage respectively to the first and second sides of the first layer of electro-optic material of the coupling portion; and third and fourth pairs of coupling-control electrodes arranged for applying a control voltage respectively to the first and second sides of the second layer of electro-optic material of the coupling portion.

According to an embodiment of the present disclosure, said layers of electro-optic material of the first and second strips of light conducting semiconductor materials of the coupling portion comprise each a layer of undoped or unintentionally doped material; the first and second strips of light conducting semiconductor materials further comprising layers of N and/or P-doped materials such that said layers of undoped or unintentionally doped material form the central portions of PIN diodes in opposing series, and said layers of N or P-doped material the P and N portions of the PIN diodes; said coupling-control electrodes being in contact with first and second sides of said layers of N or P-doped materials for applying said control voltage to the first and second sides of said PIN diodes.

According to an embodiment of the present disclosure, the optical coupler further comprise third and fourth photonic waveguides according to the present disclosure, wherein: end portions of the first strip of light conducting semiconductor materials of the third and fourth photonic waveguides join laterally to form the first and second sides of a second end of the first strip of light conducting semiconductor material of the coupling portion; and corresponding end portions of the second strip of light conducting semiconductor materials of the third and fourth photonic waveguides join laterally to form the first and second sides of a second end of the second strip of light conducting semiconductor material of the coupling portion.

According to an embodiment of the present disclosure, the width and height of the first strip of light conducting semiconductor material of the coupling portion are such that the first strip of light conducting semiconductor material of the coupling portion can confine two-wave-guided modes of the first wavelength and the width and height of the second strip of light conducting semiconductor material of the coupling portion are such that the second strip of light conducting semiconductor material of the coupling portion can confine two-wave-guided modes of the second wavelength.

According to an embodiment of the present disclosure, the optical coupler comprises a light absorber coupled to one of the first, second, third or fourth photonic waveguides.

According to an embodiment of the present disclosure, the optical coupler comprises an optical phase shifter according to the present disclosure coupled to one of said first and second photonic waveguides.

An embodiment of the present disclosure relates to an optical emitter abutting and optically coupled to a section of a photonic waveguide according to the present disclosure; wherein: the second strip of light conducting semiconductor material of the photonic waveguide section extends into the optical emitter and has a length and an emitter end surface perpendicular to said length; and the first strip of light conducting semiconductor material of the photonic waveguide section extends into the optical emitter and has a bottom surface and a slanted end surface extending between said bottom surface and a bottom edge of the emitter end surface; wherein said slanted end surface, as well as the side surfaces of the first and second strips, are covered with a metal layer.

An embodiment of the present disclosure relates to an optical emitter abutting and optically coupled to a section of a photonic waveguide according to the present disclosure; the optical emitter comprising superposed first and second strips of light conducting semiconductor materials of the same materials as the photonic waveguide, and having an input section, an inner section and an output section wherein: in the input section, the width and height of the superposed first and second strips of light conducting semiconductor materials are the same as those of the superposed first and second strips of light conducting semiconductor materials of the photonic waveguide to which it is coupled; in the inner section, the width of the second strip of light conducting semiconductor material is such that the second strip of light conducting semiconductor material is adapted to confine an optical mode of the first wavelength as well as an optical mode of the second wavelength; and in the inner section, the width of the first strip of light conducting semiconductor material is such that the first strip of light conducting semiconductor material is too narrow to confine an optical mode of either the first or the second wavelengths; wherein the widths of the first and second strips of light conducting semiconductor material change gradually from the input section to the inner section of the optical emitter; and wherein in the output section, the second strip of light conducting material ends, forming an emitter end surface normal to the length of the second strip of light conducting material, the width and height of the emitter end surface being too narrow to confine an optical mode of either the first or the second wavelengths; wherein the width and height of the second strip of light conducting semiconductor material change gradually from the inner section of the optical emitter to the emitter end.

According to an embodiment of the present disclosure, the optical emitter is arranged between top, bottom and lateral metallic walls forming a truncated pyramid, wherein said emitter end surface form the truncated end of the pyramid, wherein in the output section, at least the sides of the second strip of light conducting material follow the lateral metallic walls.

An embodiment of the present disclosure relates to a mono-dimensional optical phased array comprising a plurality of parallel optical channels formed on a substrate, each optical channel comprising at least one optical input waveguide according to the present disclosure, the input section of the optical input waveguide opening on a first side of the substrate, the output section of the optical input waveguide being coupled to an input of an optical coupler according to the present disclosure; an output of the optical coupler being connected by an optical phase shifter according to the present disclosure to an optical emitter opening on a second side of the substrate.

According to an embodiment of the present disclosure, a mono-dimensional optical phased array comprises at least two adjacent optical channels that share a same optical coupler; wherein the optical input waveguide, optical emitter, coupler and phase shifter of the optical channels are connected together by photonic waveguides according to the present disclosure.

According to an embodiment of the present disclosure, the optical emitter of at least one optical channel is an emitter having input, inner and output sections as described above.

According to an embodiment of the present disclosure, the optical emitters of the optical channels are separated from each other by pseudo-random distances on said second side of the substrate.

An embodiment of the present disclosure relates to a two-dimensional optical phased array comprising a plurality of mono-dimensional optical phased array as described above arranged in a stack, the second sides of the substrates of the plurality of mono-dimensional optical phased array forming an emitter side surface of the stack; wherein each of the plurality of mono-dimensional optical phased array has a thickness selected such that the optical emitters of the different mono-dimensional optical phased arrays are separated by pseudo-random distances.

According to an embodiment of the present disclosure, the number of optical emitters of each of mono-dimensional optical phased array is more than twice the number of mono-dimensional optical phased arrays.

According to an embodiment of the present disclosure, the density of optical emitters is larger toward the center of the emitter side surface of the stack than toward the edges of the emitter side surface of the stack.

Other embodiments of the present disclosure relate to an optical phase shifter comprising a photonic waveguide according to the present disclosure, wherein at least one strip of light conducting semiconductor material comprises a layer of thermo-optic material; the phase shifter further comprising a temperature control element arranged for controllably changing the temperature of the thermo-optic material.

According to an embodiment of the present disclosure, the first and second strips of light conducting semiconductor materials comprise each a layer of thermo-optic material; the phase shifter further comprising first and second temperature control elements arranged for controllably changing the temperature of the thermo-optic material of the first and second strips of light conducting semiconductor materials.

According to an embodiment of the present disclosure, each temperature control element comprises a resistor capable of producing heat, the optical phase shifter comprising a heat conductor capable of evacuating heat.

According to an embodiment of the present disclosure, the optical shifter comprises between the first and second strips of light conducting semiconductor materials an intermediate strip of light conducting semiconductor material having a refractive index comprised between the first and second refractive indexes, the intermediate strip of light conducting material having a thermal conductivity that is lower than the thermal conductivity of the materials comprising the first and second strips.

According to an embodiment of the present disclosure, the width and height of the intermediate strip of light conducting semiconductor material are such that the intermediate strip of light conducting semiconductor material is too narrow to confine an optical mode of the first wavelength.

An embodiment of the present disclosure relates to an optical coupler comprising first and second photonic waveguides according to the present disclosure; wherein end portions of the first strip of light conducting semiconductor materials of the first and second photonic waveguides join laterally to form respectively first and second sides of a first end of a first strip of light conducting semiconductor material of a coupling portion; corresponding end portions of the second strip of light conducting semiconductor materials of the first and second photonic waveguides join laterally to form respectively first and second sides of a first end of a second strip of light conducting semiconductor material of the coupling portion; wherein the first and second strips of light conducting semiconductor materials of the coupling portion respectively comprise first and second layers of thermo-optic materials; the optical coupler further comprising: first and second temperature control elements arranged for controllably changing the temperature of respectively the first and second sides of the first layer of thermo-optic material of the coupling portion; and third and fourth temperature control elements arranged for controllably changing the temperature of respectively the first and second sides of the second layer of thermo-optic material of the coupling portion.

According to an embodiment of the present disclosure, the optical coupler further comprises third and fourth photonic waveguides according to the present disclosure, wherein: end portions of the first strip of light conducting semiconductor material of the third and fourth photonic waveguides join laterally to form respectively the first and second sides of a second end of the first strip of the coupling portion; and corresponding end portions of the second strip of light conducting semiconductor material of the third and fourth photonic waveguides join laterally to form the first and second sides of a second end of the second strip of the coupling portion.

According to an embodiment of the present disclosure, the width and height of the first strip of light conducting semiconductor material of the coupling portion are such that the first strip of light conducting semiconductor material of the coupling portion can confine two-wave-guided modes of the first wavelength and the width and height of the second strip of light conducting semiconductor material of the coupling portion are such that the second strip of light conducting semiconductor material of the coupling portion can confine two-wave-guided modes of the second wavelength.

According to an embodiment of the present disclosure, such optical coupler comprises a light absorber coupled to one of the first, second, third and fourth photonic waveguides.

According to an embodiment of the present disclosure, the optical coupler comprises an optical phase shifter having thermo-optic materials, the phase shifter coupled to one of the first and second photonic waveguides.

According to an embodiment of the present disclosure, each temperature control element comprises a resistor capable of producing heat and the optical coupler further comprises a heat conductor capable of evacuating heat.

According to an embodiment of the present disclosure, the optical coupler having thermo-optic materials comprises, between the first and second sides of each strip of light conducting semiconductor material of the coupling portion, an insulating region that allows light in the first side of the strip of light conducting semiconductor material of the coupling portion to couple with light in the second side of the strip of light conducting semiconductor material of the coupling portion and reciprocally while reducing heat coupling between the first and second sides of the coupling portion.

According to an embodiment of the present disclosure, the optical coupler having thermo-optic materials has, between the first and second strips of light conducting semiconductor materials of the coupling portion, an intermediate strip of light conducting semiconductor material having a refractive index comprised between the first and second refractive indexes, the intermediate strip of light conducting material having a thermal conductivity that is lower than the thermal conductivity of the materials comprising the first and second strips.

An embodiment of the present disclosure relates to a mono-dimensional optical phased array comprising a plurality of parallel optical channels formed on a substrate, each optical channel comprising at least one optical input waveguide according to the present disclosure, having its input section opening on a first side of the substrate, the output section of the optical input waveguide being coupled to an input of an optical coupler having thermo-optic materials; an output of the optical coupler being connected by an optical phase shifter having thermo-optic materials to an optical emitter opening on a second side of the substrate.

According to an embodiment of the present disclosure, the mono-dimensional optical phased array having thermo-optic materials comprises at least two adjacent optical channels that share a same optical coupler, wherein the optical input waveguide, optical emitter, coupler and phase shifter of each optical channel are connected together by photonic waveguides according to the present disclosure.

According to an embodiment of the present disclosure, the optical emitters of the optical channels are separated from each other by pseudo-random distances on said second side of the substrate.

An embodiment of the present disclosure relates to a two-dimensional optical phased array comprising a plurality of mono-dimensional optical phased array having thermo-optic materials, the mono-dimensional arrays arranged in a stack, the second sides of the substrates of the plurality of mono-dimensional optical phased array forming an emitter side surface of the stack; wherein each of the plurality of mono-dimensional optical phased array has a thickness selected such that the optical emitters of the different mono-dimensional optical phased arrays are separated by pseudo-random distances.

According to an embodiment of the present disclosure, the number of optical emitters of each of mono-dimensional optical phased array is more than twice the number of mono-dimensional optical phased arrays.

According to an embodiment of the present disclosure, the density of optical emitters is larger toward the center of the emitter side surface of the stack than toward the edges of the emitter side surface of the stack.

BRIEF DESCRIPTION OF THE DRAWINGS

FIGS. 5A and 5B illustrate the change in optical mode profiles at a beginning and an end of an input waveguide according to an embodiment of the present disclosure receiving light comprising a plurality of wavelengths.

FIGS. 8A to 8C show the temperature profiles, transient heating and cooling responses in the optical phase shifter of FIG. 6.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
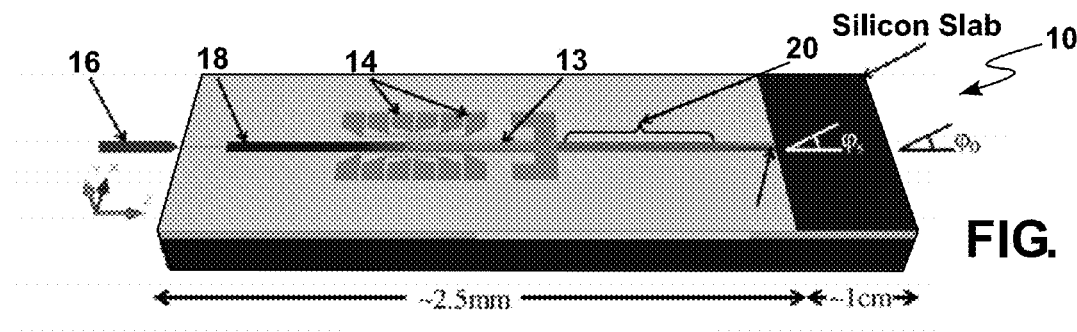
FIG. 1 illustrates a known optical phased array using optical-waveguide devices.
Figure 2:
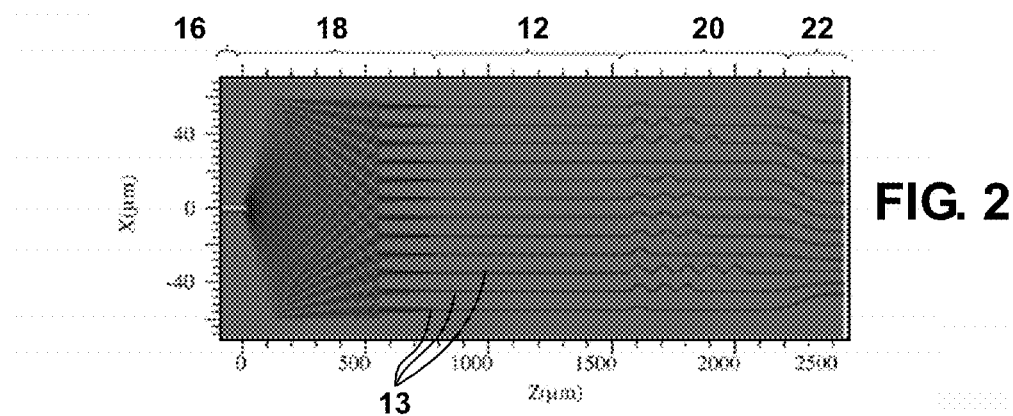
FIG. 2 illustrates a detail of the phased array of FIG. 1.
Figure 3:
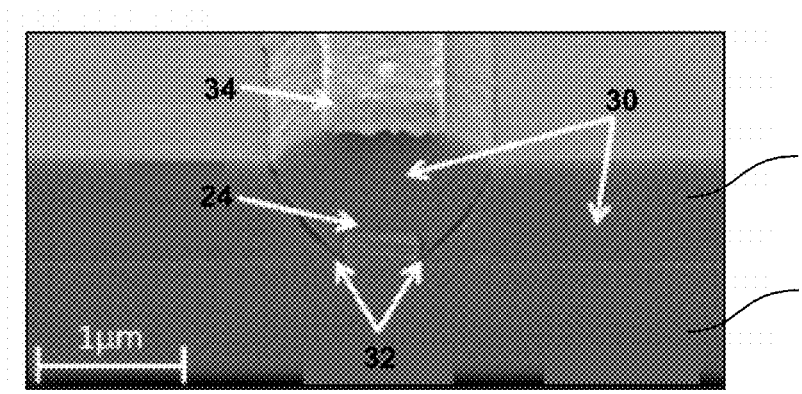
FIG. 3 is a photograph showing the cross section of a thermo-optic phase shifter of the phased array shown in FIGS. 1 and 2
Figure 4A:
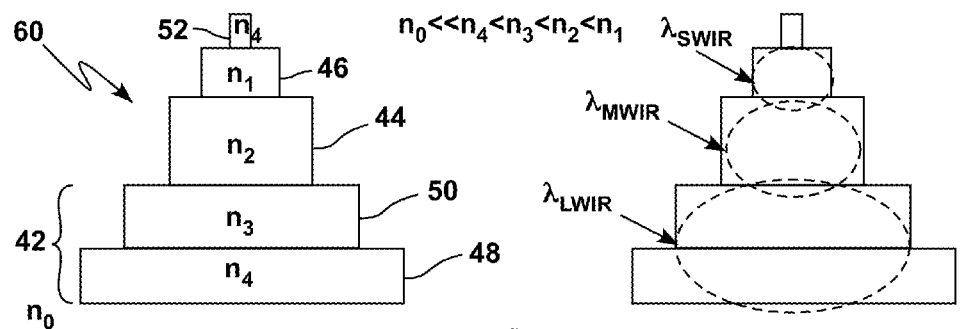
FIG. 4A shows a cross section of a photonic waveguide according to an embodiment of the present disclosure.

FIG. 4A shows a cross section of a photonic waveguide 40 according to an embodiment of the present disclosure, which comprises first, second and third superposed strips 42, 44, 46 of light conducting semiconductor materials having different refractive indexes. According to an embodiment of the present disclosure, strips 42, 44, 46 can be parallelepipeds coupled together by their top and/or bottom surfaces in order of increasing refractive index, with their axis parallel. According to an embodiment of the present disclosure, strips 42, 44, 46 of increasing refractive index are of diminishing width, thus giving to photonic waveguide 40 a stepped pyramid cross section. According to an embodiment of the present disclosure, photonic waveguide 40 can be surrounded by a cladding matrix 46 having a refractive index smaller than the refractive index of any of the superposed strips. Alternatively, photonic waveguide 40 can be surrounded by air.

According to an embodiment of the present disclosure, photonic waveguide 40 is provided for conducting separately three different wavelengths of light. Those wavelengths can be spaced fairly far apart from each other and may lie in different spectral bands. For example, one wavelength may lie in the short-wave infrared (SWIR) band and between 1.4 and 2.2 µm. Another wavelength may lie in the mid-wave infrared 1 (MWIR1) band between 3.0 and 4.0 µm. Yet another wavelength may lie in the mid-wave infrared 2 (MWIR2) band between 4.4 and 5.0 µm. Another wavelength also may lie in a portion of the long-wave infrared (LWIR) band between 8 and 10 µm. The exemplary embodiment illustrated in FIG. 4A comprises three strips, but the embodiments of the present disclosure can comprise a different number of strips, such as two or four or more strips. The exemplary embodiment illustrated in FIG. 4A comprises consecutive strips 42, 44, 46 of diminishing width, but embodiments of the present disclosure can comprise strips arranged differently, such as having other relationships between their widths or separated by intermediate strips of reduced widths, as discussed hereinafter.

According to an embodiment of the present disclosure, the width and height of the narrowest strip 46 are such that the narrowest strip 46 is adapted to confine an optical mode of the light to be conducted by photonic waveguide 40 having the shortest wavelength, but is too narrow to confine an optical mode of the two other lights to be conducted by photonic waveguide 40.

According to an embodiment of the present disclosure, the width and height of the second narrowest strip 44 are such that the second narrowest strip 44 is adapted to confine an optical mode of the light to be conducted by photonic waveguide 40 having the second shortest wavelength, but is too narrow to confine an optical mode of the light having the longest wavelength to be conducted by photonic waveguide 40.

According to an embodiment of the present disclosure, the width and height of the broadest strip 42 are such that the broadest strip 42 is adapted to confine an optical mode of the light to be conducted by photonic waveguide 40 having the longest wavelength.

According to an embodiment of the present disclosure, strip of light conducting semiconductor material 42 can be comprised of two or more strips 48, 50 of different materials having different refractive indexes and different widths, thus adding a further step to the pyramidal cross section of photonic waveguide 40. In such an embodiment, the strip 50 of higher refractive index can be narrower and located higher in the pyramidal cross section than the strip 48 of lower refractive index.

According to an embodiment of the present disclosure, photonic waveguide 40 can comprise a further strip of light conducting semiconductor material 52, coupled on top of and narrower than the narrowest light conducting strip 46. According to an embodiment of the present disclosure, further strip 52 is too narrow to confine an optical mode of the light to be conducted by photonic waveguide 40 having the shortest wavelength, and its refractive index is smaller than the refractive index of the narrowest light conducting strip 46. According to an embodiment of the present disclosure, the refractive index of further strip 52 can be the same as the refractive index of the strip of broadest width 48 of photonic waveguide 40. As detailed hereafter, further strip 52 can be used to support control electrodes for controlling the refractive index of the narrowest light conducting strip 46 when photonic waveguide 40 is used in an optical phase shifter or an optical coupler.

Figure 4B:
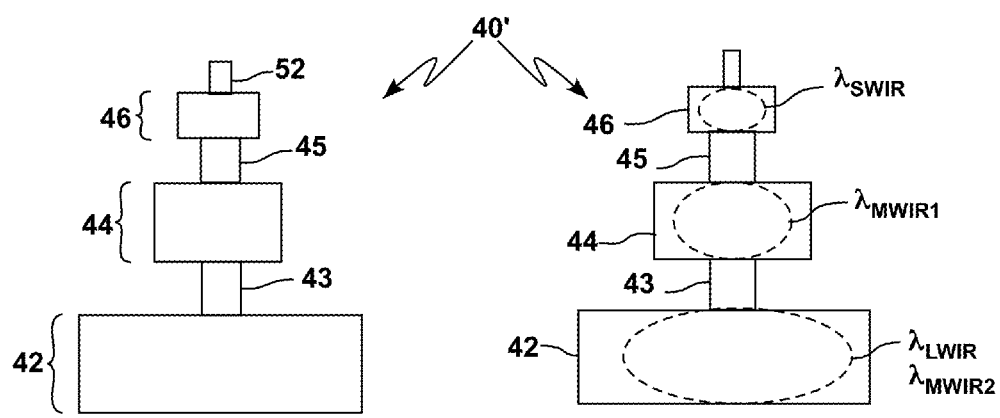
FIG. 4B shows a cross section of a photonic waveguide according to an embodiment of the present disclosure.

FIG. 4B shows a cross section of a photonic waveguide 40' according to an embodiment of the present disclosure, which comprises first, second and third superposed strips 42, 44, 46 of light conducting semiconductor materials as disclosed previously in relation with FIG. 4A. In addition, waveguide 40' comprises between strips 46 and 44 an intermediate strip of light conducting semiconductor material 45 having a refractive index comprised between the refractive indexes of strips 46 and 44, and having a width and a height such that the optical modes of the two longer wavelengths (e.g., $\lambda_{MWIR1}$ and $\lambda_{LWIR}$) are not confined in the vicinity of strip 46 but rather are confined in the other strips. Similarly, waveguide 40' comprises between strips 42 and 44 an intermediate strip of light conducting semiconductor material 43 having a refractive index comprised between the refractive indexes of strips 42 and 44, and having a width and a height such that the optical mode of the longest wavelength (e.g., $\lambda_{MWIR2}$ or $\lambda_{LWIR}$) is not confined in the vicinity of strip 44 but rather is confined in the vicinity of strip 42.

According to an embodiment of the present disclosure, waveguide 40' comprises 6 superposed strips 42, 43, 44, 45, 46 and 52. The materials in layers 42 through 46 have successively higher optical refractive index (i.e., $n_1<n_2<n_3<n_4<n_5$). According to an embodiment of the present disclosure, layers 42 and 52 have the same material. Waveguide 40' is designed to support three wavelengths of light, which are centered in layers 42, 44 and 46, with the shortest wavelength in layer 46 and the longest wavelength in layer 42.

According to an embodiment of the present disclosure, waveguide 40' can guide and spatially separate light of having three different wavelengths, such as wavelengths in the SWIR, MWIR1 and MWIR2/LWIR bands. The layer 42 at the bottom of waveguide 40' has the lowest refractive index and each layer above it has successively higher refractive index, with the top guiding layer (e.g., layer 46) having the highest refractive index. If all layers were of the same size, all the wavelengths of light would have their fundamental mode located primarily in layer 46, with layer 52 acting as an upper cladding region. As detailed hereafter with respect to FIG. 5A, an input waveguide 40" coupled to waveguide 40' can comprise a stack of layers 42', 43', 44', 45', 46' and 52' of same heights and materials as layers 42, 43, 44, 45, 46 and 52 but having all a same large width as layer 42. All three light wavelengths can then be input in the layer 46' of highest refractive index. The width of layer 46' is then gradually reduced until the cross-sectional area of layer 46' can no longer support light of the longer wavelengths and can support only the shortest wavelength (e.g., only 1.5-1.7 μm). The light of the two longer wavelengths is essentially "squeezed out" into the waveguide layers below, which have a larger cross-section area (although their refractive index is lower). Consistently, the cross-sectional area of layers 45' and 44' is reduced until layer 44' can no longer support light of the longest wavelength but only supports light of the middle wavelength (e.g., 3.2-3.8 μm), and layer 45' can no longer support any of the lights waveguide 40' is provided to conduct. By also pinching the width of layer 43', light of the longest wavelength (e.g., 4.6-9.5 μm) is further "squeezed" into layer 42', which still has sufficiently large cross-section area to support the optical mode for that longer-wavelength light. According to an embodiment of the present disclosure, the thicknesses of intermediate layers 43' and 45', which act as spacers to separate the optical modes of the three wavelengths of light, are chosen to achieve a desired physical separation between the optical-field profiles of those modes. According to an embodiment of the present disclosure, this is accomplished by having intermediate layers with a refractive index between the refractive indexes of the layers they separate, and with dimensions such that the intermediate layers cannot confine a mode of the light that can be confined only in the lowest of the layers they separate.

The inventors have calculated the optical mode profiles for waveguide 40' with the light at wavelengths of 1.5 μm ($\lambda_{SWIR}$), 3.2 μm and 3.8 μm ($\lambda_{MWIR1}$), 4.7 μm ($\lambda_{MWIR2}$), 8.5 μm and 9.5 μm ($\lambda_{LWIR}$). The calculated mode profiles are essentially the same for vertically and horizontally polarized light. These mode profiles indicate that the light at 1.5 μm wavelength is located mainly in layer 46. The light at both MWIR1 wavelengths, 3.2 μm and 3.8 μm, is located mainly in layer 44. Also, the light at the MWIR2 wavelength, 4.7 μm, is located primarily in layer 42. The LWIR light at 8.5 μm and 9.5 μm wavelengths is located primarily in layer 1. The structure of optical waveguide 40' separates the light by grouping the wavelengths of light into bands. For the example illustrated, the same 3-band waveguide structure can be used to operate with 3 wavelengths that are in the SWIR/MWIR1/MWIR2 bands or with 3 wavelengths that are in the SWIR/MWIR/LWIR bands.

Calculation has shown that the modes of Transverse Electric (TE) polarized light are confined more tightly in their respective layers 42, 44 and 46 of the structure, with little extension of that light into layers 43 and 45, whereas the modes for Transverse Magnetic (TM) polarized light extend farther in the vertical direction, into layers 43 and 45. According to an embodiment of the present disclosure, in order to achieve better thermal isolation between the modes of the various wavelengths, so that the phases of those wavelengths can be adjusted thermally with the least interdependence, TE polarized light could be used. According to embodiments of the present disclosure, heating that produces changes in the phase of the three wavelengths of light can be applied separately to layers 46, 44 and 42. Layers 45 and 43 are designed to have substantially lower thermal conductivity (especially in the vertical direction) than the other layers, in order to provide some thermal isolation between the three actively heated regions.

According to an embodiment of the present disclosure, as an alternative to focusing the input light into layer 46' only, the input light can be input in other layers, for example down to layer 42'. In such an embodiment, the width of these other layers receiving the input light can first be reduced to squeeze all light up into layer 46' before gradually narrowing the layers as detailed above, to separate appropriately the optical modes of the three wavelengths of light.

Figure 4C:
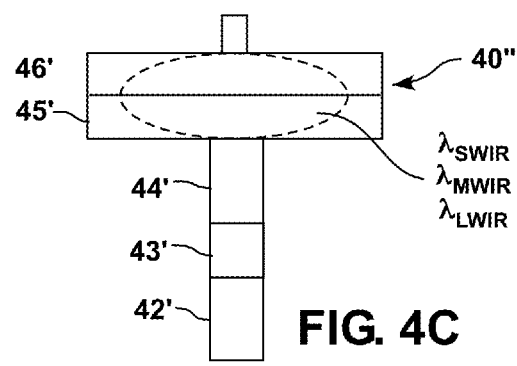
FIG. 4C shows a cross section of an input waveguide according to an embodiment of the present disclosure.

FIG. 4C shows a cross-section of the input waveguide 40" after the width of the bottom layers (42', 43', 44') was narrowed down to squeeze out the light from these layers into layers 45' and 46'. Alternatively, an input waveguide 40 can directly be made to have an input cross section as shown in FIG. 4C. FIG. 4C further illustrates the location of the optical modes of all three wavelengths for input waveguide 40" depicting the light of all wavelengths as being concentrated in the layers 45', 46'.

FIG. 5A shows a cross section of an input photonic waveguide 40", provided to be coupled to photonic waveguide 40 according to an embodiment of the present disclosure. As outlined above, input photonic waveguide 40" can comprise a stack of layers 42', 43', 44', 45', 46' and 52' of same heights and materials as layers 42, 43, 44, 45, 46 and 52 but having all a same broad width such as the width of layer 42 of waveguide 40.

As shown in FIG. 5A, layer 46' of highest refractive index receives axially three lights of different wavelengths $\lambda 1$, $\lambda 2$ and $\lambda 3$, such as $\lambda 1=1.5$ μm, $\lambda 2=4$ μm and $\lambda 3=9$ μm. FIG. 5A shows three diagrams indicating the position of the optical modes of the lights for $\lambda 1$, $\lambda 2$ and $\lambda 3$, in the strip of highest refractive index 46'.

According to an embodiment of the present disclosure, the width of layer 46' is then gradually reduced until the cross-sectional area of layer 46' can no longer support lights $\lambda 2$ and $\lambda 3$ of the longer wavelengths and can support only the shortest wavelength $\lambda 1$. The light of the two longer wavelengths is essentially "squeezed out" into the waveguide layers 44' and 42' below, which have a larger area (although their refractive index is lower). Next, the cross-sectional area of layer 44' is reduced until layer 44' can no longer support light of the longest wavelength $\lambda 3$ but only supports light of the middle wavelength $\lambda 2$, thus "squeezing" light of the longest wavelength $\lambda 3$ into layer 42', which still has sufficiently large area to support the optical mode for that longer-wavelength light. According to an embodiment of the present disclosure, the three lights $\lambda 1$, $\lambda 2$ and $\lambda 3$ can be provided to input waveguide 40' using a focusing lens (not shown).

FIG. 5B shows a cross section of a photonic waveguide 40 coupled in output of input waveguide 40" of FIG. 5A. FIG. 5B shows three diagrams indicating the position of the optical modes of the lights for $\lambda 1$, $\lambda 2$ and $\lambda 3$, in waveguide 40. According to an embodiment of the present disclosure, the light of shorter wavelength $\lambda 1$ is confined in the strip of higher refractive index 46 of waveguide 40. According to an embodiment of the present disclosure, the light of second shorter wavelength $\lambda 2$ is confined in the strip of second higher refractive index 44 of waveguide 40. According to an embodiment of the present disclosure, the light of longest wavelength $\lambda 3$ is confined in the strip of overall lowest refractive index 42 of waveguide 40.

Figure 5C:
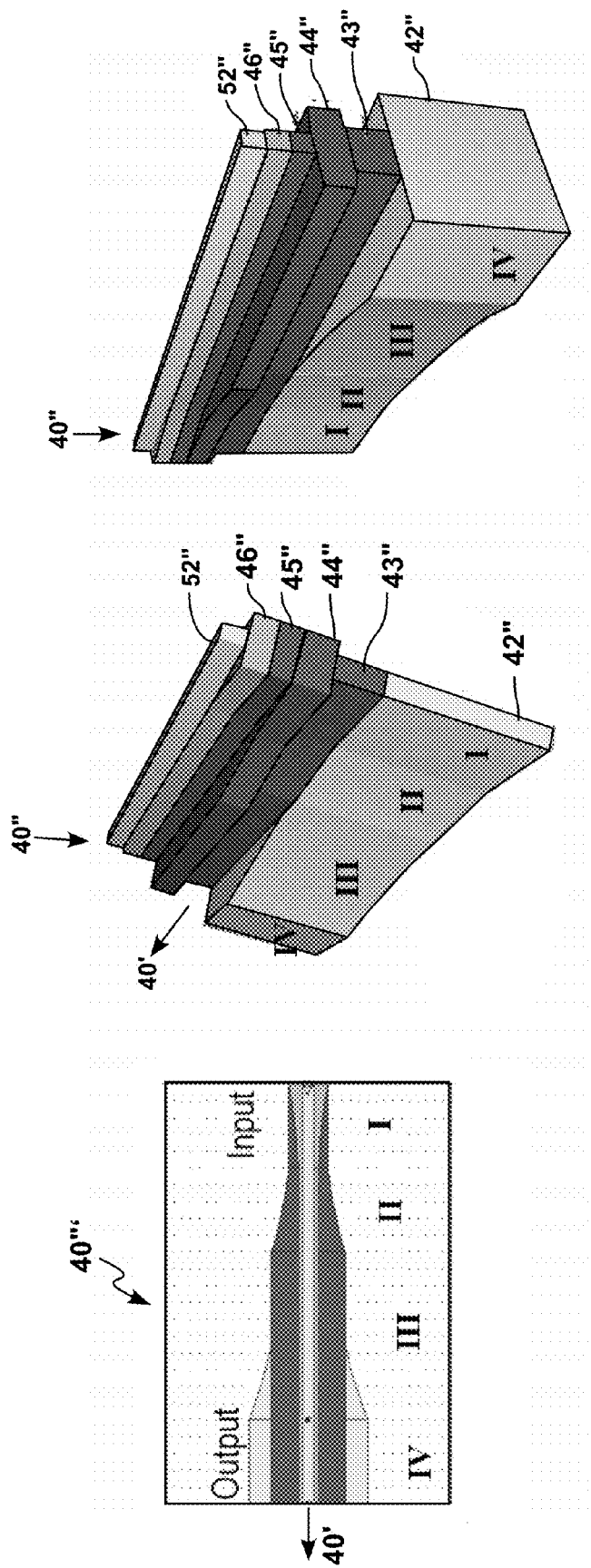
FIG. 5C shows an input waveguide according to an embodiment of the present disclosure.

FIG. 5C shows a top view as well as front and back elevation views of an exemplary optical input waveguide 40''' provided as a coupling-in input of waveguide 40' of FIG. 4B, to receive axially light comprising the λ1, λ2, λ3 wavelengths and separate them. According to an embodiment of the present disclosure, input waveguide 40''' comprises stacked layers 42'', 43'', 44'', 45'', 46'' and 52'' of the same materials and thicknesses as the layers 42, 43, 44, 45, 46 and 52 of the waveguide 40' to which they couple into. According to an embodiment of the present disclosure, input waveguide 40''' comprises tapers or gradual variations in the width of the layers 42'', 43'', 44'', 45'', 46'' and 52'' that occur, longitudinally, along the length of the structure. Input waveguide 40''' accepts light focused onto a portion of its multi-layer structure and uses tapers in the width of those layers to direct the different wavelengths of that light into their respective destinations. According to an embodiment of the present disclosure, input light of multiple wavelengths λ1, λ2, λ3 can be coupled, such as by means of a focusing lens (not shown), primarily into layers 46'' and 45'' of the structure. These wavelengths may be in different bands, such as SWIR, MWIR1 and MWIR2. According to an embodiment of the present disclosure, the waveguide structure at the input end of input waveguide 40''' is widest in layers 44'', 45'', 46'', to support that multi-band light. At the output end of input waveguide 40''', the three wavelengths λ1, λ2, λ3 have become centered in layers 46'', 44'' and 42'', with the λ1 (e.g. SWIR) light located in layer 46'', the λ2 (e.g. MWIR1) light located in layer 44'', and the λ3 (e.g. MWIR2-LWIR) light located in layer 42'', as indicated by the dotted circles or ovals drawn in FIG. 4B.

According to an embodiment of the present disclosure, input waveguide 40''' comprises three tapered sections, illustrated in FIG. 5C as sections I, II and III, and a terminal or output section, illustrated in the figure as section IV. According to an embodiment of the present disclosure the widths of layers 42'', 43'', 44'', 45'', 46'' and 52'' at the output end of input waveguide 40''' can be the same as the widths of layers 42, 43, 44, 45, 46 and 52 of the waveguide 40' to which they couple into.

According to an embodiment of the present disclosure, sections I and II can for example be 5 mm long and section III can for example be 10 mm long. Section IV can be the first portion of the next multi-band waveguide component of the channel. Multi-band light at for example 1.55 μm, 3.8 μm and 4.7 μm wavelengths can be coupled into layer 46'' of the structure at the input end of section I. At that input end of section I, layers 44'', 45'' and 46'' can have the same width, where that width (e.g., 2.3 μm) is greater than the width (e.g., 1 μm) of layers 42'' and 43''. Since layer 46'' has the highest refractive index, the input light would tend to remain in that layer. In section I, the width of layers 45'' and 46'' is tapered down exponentially, for example until that width becomes only 1.15 μm. The reduced width of layers 45'' and 46'' forces the light of larger wavelengths, for example 3.8 μm and 4.7 μm, out from layer 46'' and into layer 44''. In section II, the width of layer 44'' is gradually increased (in another exponential taper) until it reaches the desired final value (e.g., 3.6-4.3 μm). In this section, layers 42'' and 43'' are recessed underneath layer 44'' by a fixed amount (e.g., by 0.6-1.0 μm on each side). Thus, the width of layers 42'' and 43'' also increases gradually. The enlargement of layer 44'' ensures that the light of intermediate wavelength, for example 3.8 μm, will remain in layer 44'' even when the width of layer 42'' becomes larger.

In section III, the width of layer 42'' is increased gradually until that width reaches its final value (e.g., 7 μm or larger). The desired final width for layer 42'' depends on the longest wavelength of the light to be supported by the multi-band structure. For example, a width of 7 μm is sufficient for 4.7 μm wavelength but the width of layer 42'' is preferably around 10-11 μm if the structure is to guide 9.5 μm wavelength light. A wider layer 42'' ensures that the optical mode, even for the longest wavelength light, has negligible overlap with the corners of layer 42'', at which metal heater electrodes can be placed according to an embodiment of the present disclosure.

According to an embodiment of the present disclosure, the tapered sections of input waveguide 40' can efficiently move the optical energy for lights such as MWIR1 and MWIR2 lights into modes located at their desired destinations while incurring little loss of that light to scattering or reflection.

Figure 5D:
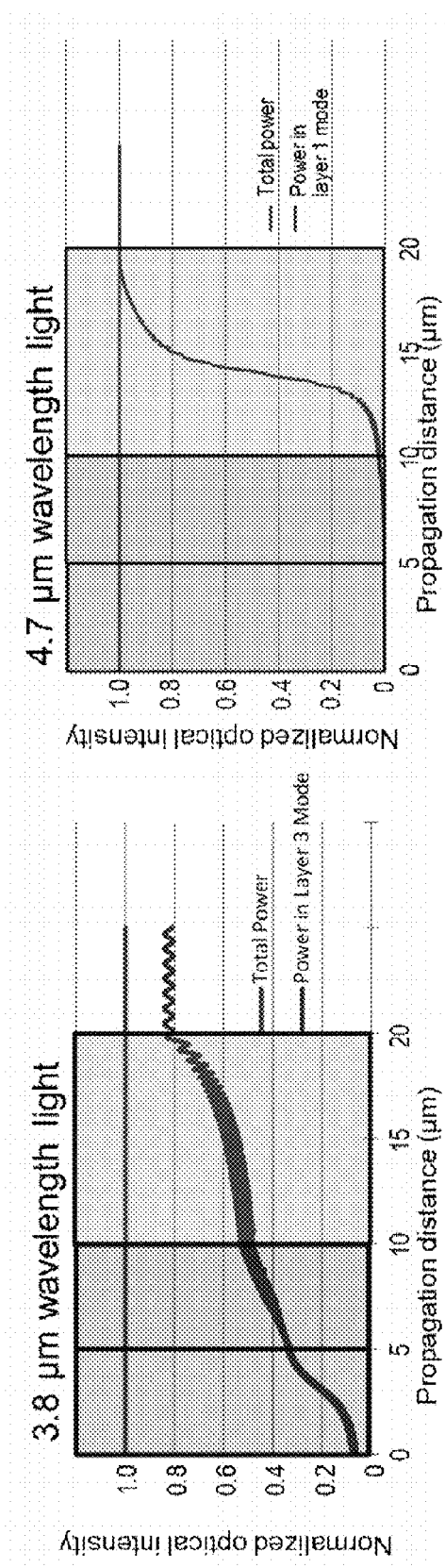
FIG. 5D illustrates the separation of light in the input waveguide of FIG. 5C.

FIG. 5D shows examples of the optical power or intensity, at 3.8 μm and 4.7 μm wavelength, calculated for various locations along an exemplary input waveguide 40''' from its input end (propagation distance 0 mm) to its output end (propagation distance 20 mm). The plots show that the light at 4.7 μm wavelength moves into layer 1 only in taper section III. In contrast, the light at 3.8 μm wavelength moves gradually into the mode centered in layer 3 over the length of all three taper sections. Essentially all of the 4.7 μm light moves into the fundamental mode that is centered in layer 1. However, for the 3.8 μm light, only about 80% of that light is transferred into its lowest-order mode, which is centered in layer 3. The rest of the 3.8 μm light is in the other modes, which have substantial overlap with other regions of the structure, such as with layer 5 or even layer 1.

Some examples of materials that could comprise the layers of the waveguide structure 40 are as follows. These materials can all be lattice matched to InP and intended to be transparent to light of wavelength >1.45 μm. Layer 42 of the waveguide structure can be fabricated from a InP substrate. Layer 46 can be a quaternary InGaAsP material whose bandgap wavelength is approximately 1.38 μm. Layer 46 has the highest refractive index. Layer 44 can be comprised of multiple sub-layers of the InGaAsP and InP, and thus have its refractive index between those of layers 42 and 46. According to an embodiment of the present disclosure, layer 44 can be the above multi-layer material instead of with a different InGaAsP quaternary composition, because its thermal conductivity is thus made higher, especially in the lateral or in-plane direction. The thermal conductivity of InP is approximately 10 times higher than the thermal conductivity of the quaternary (InGaAsP) or ternary (InGaAs or InAlAs) materials. According to an embodiment of the present disclosure, layer 52 serves as a lower-index upper cladding for layer 46 and can also be InP material. In structures that comprise a top heater electrode, layer 52 thus optically separates the SWIR light from its heater electrode, while efficiently conducting the heat from that electrode to the top light conducting layer 46.

According to embodiments of the present disclosure, layers 43 and 45 are thermally isolating portions of the waveguide structure. According to embodiments of the present disclosure, both of these layers comprise InGaAs/InAlAs superlattices. According to an embodiment of the present disclosure, the thermal conductivity of these superlattices can be 3-6 times lower than the thermal conductivity of their constituent materials, especially for flow of heat in the vertical or cross-plane direction. The effective bandgap of the superlattice is larger than the bandgap of bulk InGaAs material, because the electronic quantum confinement in the thin InGaAs sub-layers. Thus, the superlattice material, especially that in layer 45, can be transparent to the SWIR light. The ratios of the InGaAs and InAlAs thickness values in these two superlattices can be adjusted to obtain the desired optical refractive index values for layers 43 and 45. A further advantage of using a InGaAs/InAlAs superlattice for layers 43 and 45 is that these GaAs-based materials can be etched selectively without also removing the InP-based materials of layers 42, 44, 46 and 52.

Figure 6:
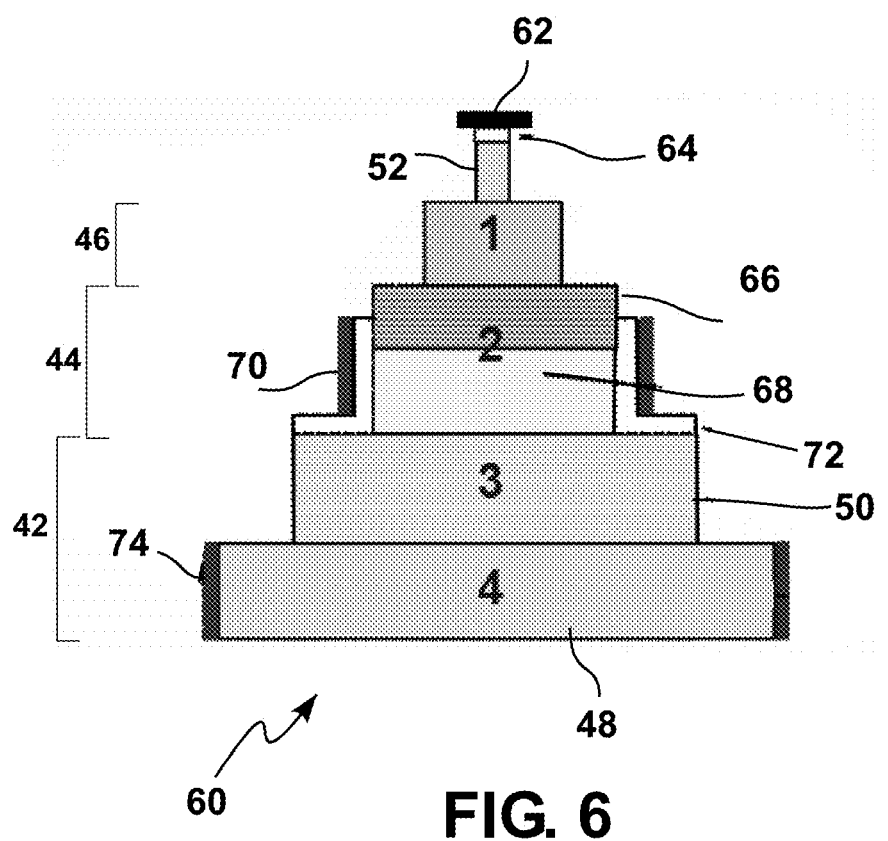
FIG. 6 shows a cross section of an optical phase shifter according to an embodiment of the present disclosure.

FIG. 6 shows a cross section of an optical phase shifter 60 according to an embodiment of the present disclosure, comprising a waveguide 40 as described above, wherein each of the first, second and third superposed strips 42, 44, 46 of light conducting semiconductor materials comprises a layer of thermo-optic material. The structures described hereafter in relation to a waveguide 40 as described above can also be adapted to a waveguide 40' as described above by introducing intermediate layers 43 and 45 where appropriate.

According to an embodiment of the present disclosure, as illustrated with respect to strip 46 in FIG. 6, the strip can itself be a layer of thermo optic material. According to an embodiment of the present disclosure, strip 46 can be a layer of GaInAsP. According to an embodiment of the present disclosure, optical phase shifter 60 comprises at least one temperature control element 62 for controllably changing the temperature of the thermo-optic material of strip 46. According to an embodiment of the present disclosure, control element 62 comprises a heater such as a resistor heater strip, for example of metal or polysilicon, arranged on top of a refractory layer 64, for example of Si3N4, itself arranged on top of strip 52. According to an embodiment of the present disclosure, strip 52 can be have a very high thermal conductivity, and can for example be comprised of InP. According to an embodiment of the present disclosure, phase shifter 60 further comprises a heat conductor (shown hereafter) capable of evacuating the heat produced by the heaters.

According to an embodiment of the present disclosure, as illustrated with respect to strip 44 in FIG. 6, the strip can comprise two layers/strips of thermo optic materials 66, 68 of same width, coupled on top of each other. According to an embodiment of the present disclosure, strip 66 can itself be an alternated succession of thin sub-layers of two materials; for example GaInAsP and AlInAs. According to an embodiment of the present disclosure, the thickness of each of the sub-layers can be less than 0.1 µm. According to an embodiment of the present disclosure, strip 68 can be made of GaInAsP. According to an embodiment of the present disclosure, the refractive index of strip 44 can be calculated globally for strips 66 and 68.

According to an embodiment of the present disclosure, optical phase shifter 60 comprises at least one temperature control element 70 for controllably changing the temperature of the thermo-optic material of strip 44. According to an embodiment of the present disclosure, control element 70 comprises a heater such as a pair of resistor heater strips, for example of metal or polysilicon, arranged on the side of strip 44. According to an embodiment of the present disclosure, the heater can be isolated from the side of strip 44 (as well as from the top of strip 42) by a refractory layer 72, for example of Si3N4. According to an embodiment of the present disclosure, control element 70 further comprises a heat conductor (shown hereafter) capable of evacuating the heat produced by the heater.

According to an embodiment of the present disclosure, as illustrated with respect to strip 42 in FIG. 6, strip 50 can be an alternated succession of thin sub-layers of two materials; for example GaInAsP and AlInAs. According to an embodiment of the present disclosure the thickness of each of the sub-layers can be less than 0.1 µm. According to an embodiment of the present disclosure, strip 48 can be made of InP. According to an embodiment of the present disclosure, the refractive index of strip 42 can be calculated globally for strips 50 and 48, if desired.

According to an embodiment of the present disclosure, optical phase shifter 60 comprises at least one temperature control element 74 for controllably changing the temperature of the thermo-optic material of strip 42. According to an embodiment of the present disclosure, control element 74 comprises a heater such as a pair of resistor heater strips, for example of metal or polysilicon, arranged on the side of strip 48. According to an embodiment of the present disclosure, control element 74 further comprises a heat conductor (shown hereafter) capable of evacuating the heat produced by the heater.

According to an embodiment of the present disclosure, the strips of the waveguide 40 of the optical phase shifter 60 are preferably are fabricated from an III-V semiconductor material system such as GaAs/GaAlAs, GaInAlAs/InAlAs/InP, or GaInAsP/InP that provides a variety of materials with different optical refractive index but with the same lattice constant. To minimize the optical free-carrier absorption loss, the layers are preferably un-doped or un-intentionally doped. These III-V materials are transparent to light having wavelengths longer than 1.4 µm and, unlike silicon, have low loss also for the LWIR light. According to an embodiment of the present disclosure, the specific materials comprising each layer of the structure are selected not only based on their refractive index but also based on their thermal conductivity. As outlined previously, in the exemplary structure for a multi-band thermo-optic phase shifter as depicted in FIG. 6, some of the layers/strips comprise a multi-layer material that consist of alternating layers of (for example) InAlAs and GaInAsP. According to an embodiment of the present disclosure, the strips of multi-layer material, for example comprised of thin sub-layers, have much higher thermal conductivity in the in-plane (lateral) direction than in the cross-plane (vertical) direction. Also, the cross-plane thermal conductivity of the multi-layer material is significantly lower than the thermal conductivity of a ternary or quaternary material. Binary materials (e.g., InP or GaAs) have the highest thermal conductivity. Exemplary values for the thermal conductivity are for example as follows:

Thermal conductivity of InP: 68 W/m-K.
Thermal conductivity of GaInAsP: 5-7 W/m-K
Thermal conductivity of a Multi-Layer: 2-4 W/m-K
Thermal conductivity of $Si_3N_4$: 1-2 W/m-K
Thermal conductivity of cladding: <1 W/m-K According to an embodiment of the present invention, the waveguide 40 of the phase shifter 60 is designed such that different wavelengths of light $\lambda 1, \lambda 2, \lambda 3$, are confined in the different strips 46, 44, 42 of the waveguide, as illustrated for example in FIG. 5B. According to an embodiment of the present disclosure, the heater strips 62, 70, 74, by controlling the temperature of the strips 46, 44, 42, controllably change the refractive index of the material encountered by those specific wavelengths of light. For example, heater strip 62 can modify in a controllable manner the refractive index of a portion of the strip 46 occupied by the $\lambda 1$ light (1.5 µm wavelength light in the illustrated example); heater strips 70 can modify in a controllable manner the refractive index of a portion of the strip 44 occupied by the $\lambda 2$ light (3 µm wavelength light in the illustrated example); and heater strips 74 can modify in a controllable manner the refractive index of a portion of the strip 46 occupied by the $\lambda 3$ light (9 µm wavelength light in the illustrated example).

According to an embodiment of the present disclosure, controlling the refractive index of portions of strips 46, 44 and 42 allows controlling the phase of the λ1, λ2 and λ3 lights. Changing the refractive index of the material changes the phase velocity of the light that passes through the material, and thus allows changing the phase of the light output by the phase shifter.

According to an embodiment of the present disclosure, some regions of multi-layer material, such as strips 50 and 66 in FIG. 6, can provide some amount of thermal isolation between the portions of the structure heated by the various heaters 62, 70 and 74. In the illustrated example, strip 66 is placed between heater 62 and heaters 70. Another region of multi-layer material, strip 50, is placed between heaters 70 and heaters 74. According to an embodiment of the present disclosure, the waveguide 40 of phase shifter 60 is designed such that the shortest wavelength λ1 light occurs mainly in strip 46 (which can be a GaInAsP layer); such that the medium-wavelength λ2 light occurs mainly in strip 68 (which can also be a GaInAsP layer of different composition from the GaInAsP material of strip 46); and such that the longest wavelength λ3 light occurs mainly in strip 48 (which can be an InP layer).

Figure 7:
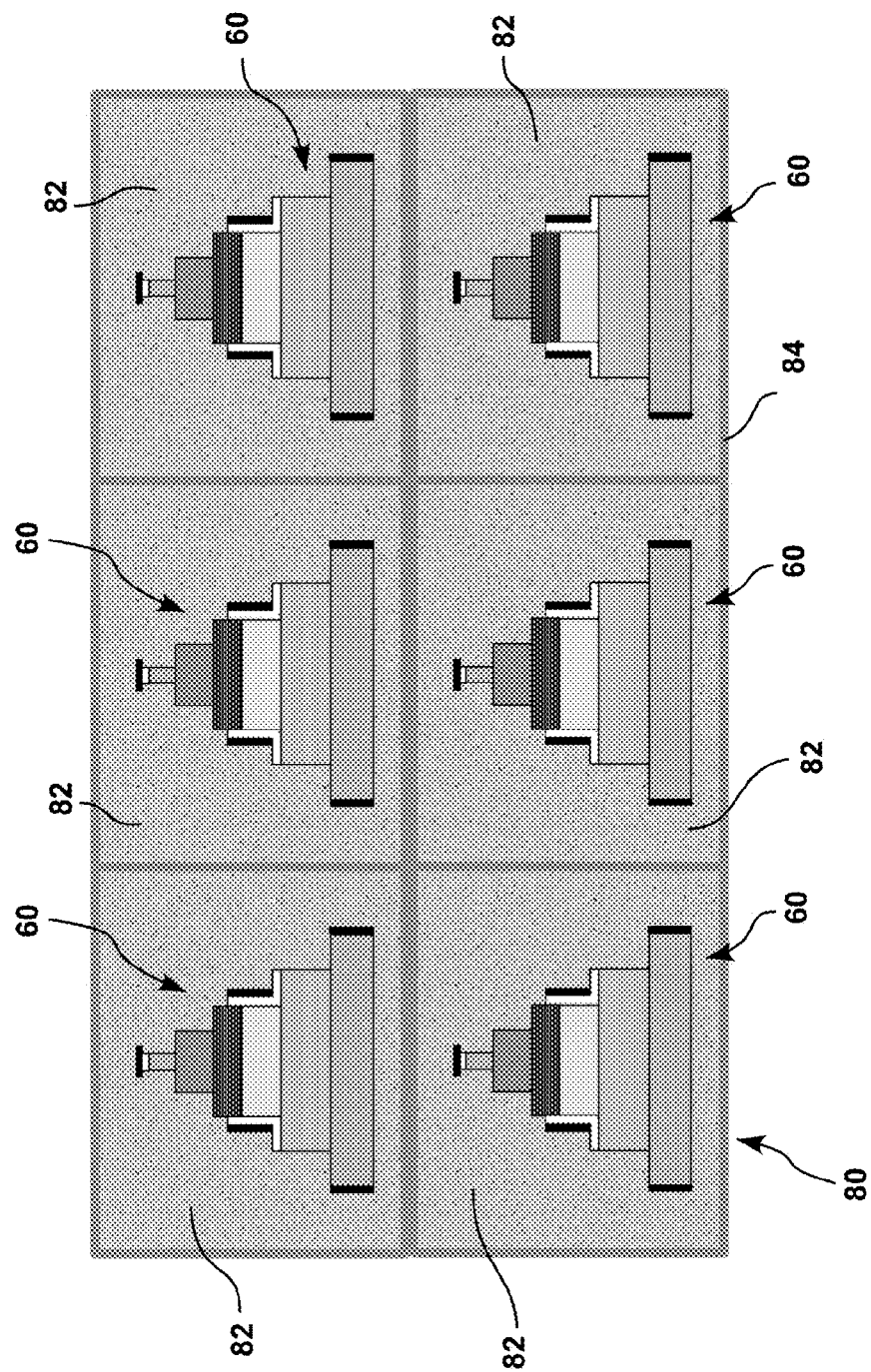
FIG. 7 shows a cross section of a bi-dimensional phased array comprising a plurality of the optical phase shifters of FIG. 6.

FIG. 7 shows a cross section of a portion of a bi-dimensional phased array 80 comprising a plurality of the optical phase shifters 60 of FIG. 6.

According to an embodiment of the present disclosure, 2-D phased array 80 comprises rows (two shown) of phase shifters 60 that are stacked above each other. According to an embodiment of the present disclosure, each phase shifter 60 can be surrounded by a cladding material 82 that can be silicon dioxide, another oxide, or a polymer that has low optical refractive index as well as low thermal conductivity. According to an embodiment of the present disclosure, each phase shifter 60, or the cladding 82 of each phase shifter 60, can be surrounded by metal walls 84 that act as a thermal sink and also provide thermal isolation between the adjacent phase shifters. According to an embodiment of the present disclosure, 2-D phased array 80 can be as described in co-pending U.S. patent Ser. No. 14/290,986, filed on May 29, 2014 and entitled: "MULTI-SLICE TWO-DIMENSIONAL BEAM FORMER ASSEMBLY" and/or co-pending U.S. patent Ser. No. 14/290,983, filed on May 29, 2014 and entitled: "A PSEUDO-RANDOMLY SPACED TWO-DIMENSIONAL PHASED ARRAY ASSEMBLY".

Thermal sinks such as metal walls 84 allow shortening of the time response between a step change in the current applied to a heater such as 62, 70 or 74, and a corresponding change in the temperature of the portion of the phase shifter associated with the heater. Indeed, walls 84 make relatively small the effective size of the thermal volume formed by the region encased by a set of walls and containing one waveguide structure. Further, the low thermal conductivity of the dielectric material/cladding 82 surrounding the waveguide structure ensures that the heater is used to control the temperature of the semiconductor materials rather than to heat the walls 84.

According to an embodiment of the present disclosure, however, walls 84 must be sufficiently close to the semiconductor waveguide structure of phase shifter 60 to ensure that when a heater current is removed, the associated portion of the structure 60 can cool rapidly to the baseline temperature of the walls. As outlined previously, the heaters 62, 70, 74 can be separated from the semiconductor structure by thin regions 64, 72 of silicon nitride. The silicon nitride has a much lower optical refractive index than the semiconductor materials and thus helps confining the light within the semiconductor materials and away from the metal heaters, otherwise the light could be absorbed by the metal of the heaters and thus increase the optical loss of the waveguide structure.

FIG. 8A shows schematically a cross section of a thermo-optic phase shifter 60 that is encased in a heat sink, for example comprising walls 84 as shown in FIG. 7. For ease of representation, the proportions of the various strips forming phase shifter 60 are not represented in FIG. 8A. FIG. 8A shows the position of 0.25 K isotherm lines with respect to the various strips of phase shifter 60 when heater 62 is used to elevate the temperature of strip 46.

FIG. 8A further comprises three curves illustrating the transient heating response of strips 46, 44 and 42 when heater 62 is used to elevate the temperature of strip 46. The temperature of strip 46 climbs reverse-exponentially to a ceiling of 1 degree in 0.2 milliseconds; the temperature of strip 44 climbs reverse-exponentially to a ceiling of 0.7 degree in 0.4 milliseconds; and the temperature of strip 42 climbs reverse-exponentially to a ceiling of 0.45 degree in 0.4 milliseconds.

FIG. 8A further comprises three curves showing the transient cooling response of strips 46, 44 and 42 when heater 62 is cut-off after having been used to elevate the temperature of strip 46. The temperatures of strips 46, 44 and 42 fall reverse-exponentially from their ceiling of when the heater is on to their level of when the level is off in about 0.3 milliseconds.

FIG. 8B shows the thermo-optic phase shifter 60 of FIG. 8A, as well as 0.25 K isotherm lines, when heater 70 is used to elevate the temperature of strip 44. FIG. 8B further comprises three curves illustrating the transient heating response of strips 46, 44 and 42 when heater 70 is used to elevate the temperature of strip 46. The temperature of strip 44 climbs reverse-exponentially to a ceiling of 3 degree in 0.2 milliseconds; the temperature of strip 46 climbs reverse-exponentially to a ceiling of 1.8 degree in 0.2 milliseconds; and the temperature of strip 42 climbs reverse-exponentially to a ceiling of 1.6 degree in 0.4 milliseconds.

FIG. 8B further comprises three curves showing the transient cooling response of strips 46, 44 and 42 when heater 70 is cut-off after having been used to elevate the temperature of strip 44. The temperature of strips 46, 44 and 42 fall reverse-exponentially from their level of when the heater is on to their level of when the level is off in about 0.4 milliseconds.

FIG. 8C shows the thermo-optic phase shifter 60 of FIG. 8A, as well as 0.25 K isotherm lines, when heater 74 is used to elevate the temperature of strip 42. FIG. 8B further comprises three curves illustrating the transient heating response of strips 46, 44 and 42 when heater 74 is used to elevate the temperature of strip 42. The temperature of strip 42 climbs reverse-exponentially to a ceiling of 10 degree in 0.1 milliseconds; the temperature of strip 46 changes reverse-exponentially to a ceiling of 7.5 degree in 0.2 milliseconds; and the temperature of strip 46 climbs reverse-exponentially to a ceiling of 5.5 degree in 0.4 milliseconds.

FIG. 8C further comprises three curves showing the transient cooling response of strips 46, 44 and 42 when heater 70 is cut-off after having been used to elevate the temperature of strip 44. The temperature of strips 46, 44 and 42 fall reverse-exponentially from their level of when the heater is on to their level of when the level is off in about 0.4 milliseconds.

FIGS. 8A, 8B and 8C were obtained using a COMSOL Multiphysics® software package simulation, provided by COMSOL, Inc. (10850 Wilshire Boulevard Suite 800; Los Angeles, Calif. 90024; USA), for a phase shifter 60 as described for example in relation with FIG. 6, provided for simultaneously controlling the phases of lights λ1, λ2, λ3 of respectively 1.5, 3 and 10 µm wavelengths.

The inventors have noted that compared to other thermo-optic materials, InP-based materials (as well as GaAs-based materials) have a large thermo-optic change in their refractive index. For a phase-shifter length of only 0.5 cm, a steady-state temperature change of only 10° C. is sufficient to produce a phase shift of 2π for 10 µm wavelength light. Similarly, a temperature change of only 3°-5° C. is sufficient to produce a phase shift of 2π for 3 µm wavelength light and a temperature change of only 1°-1.5° C. is sufficient to produce a phase shift of 2π for 1.5 µm wavelength light.

As outlined above, FIGS. 8A, 8B and 8C show examples of the calculated temperature profiles that are observed when a heating current is applied to the top electrode (62), the middle electrodes (70) or the bottom electrodes (74) of phase shifter 60. The calculations that were made assume that the heating current is sufficient to increase the temperature of the considered heaters by the specified amount. In the cross-section figures, isotherm lines of the 2-dimensional temperature distribution are shown for each 0.25° change in temperature. For these calculations, the temperature of the top heater, when that heater is on, is raised by 1° C. The temperature of the middle heater is raised by 3° C. when it is turned on. The temperature of the bottom heater is raised by 10° C. when it turned on. For a given heater, the temperature increase obtained in other regions of the shifter is smaller and slower than the temperature increase obtained in the targeted region of the structure (see plots in FIGS. 8A, 8B, 8C), allowing the temperature of each region to be controlled separately, albeit not independently.

As outlined previously, for a 10° C. step change in the heat applied to the bottom heater 74 of the phase shifter 60, a steady-state temperature distribution is established in less than 1 millisecond, with most of the temperature change occurring in <0.2 msec (see FIG. 8C). A similarly fast transient response is achieved when heat is applied to the top heater 62. The slowest transient response occurs in the portion of the waveguide structure of phase shifter 60 that is farthest from the heater. Thus, for heat applied to the middle heater 70, the steady state is reached even more rapidly.

According to an embodiment of the present disclosure, this fast transient response, which is observed for all three heaters, is achieved for a phase shifter 60 encased in thermally insulating material 82. Equally fast response is achieved when the heating is stopped and the temperature of the phase shifter cools back to the temperature of the heat sinking enclosure 84. According to an embodiment of the present disclosure, the fast cooling response is achieved because the metal thermal sink 84 that encloses the phase-shifter structure is located quite close to that structure. According to an embodiment of the present disclosure, there exists a trade-off between the amount of heater power that must be applied and the transient response of the phase shifter. Faster transient response can be achieved by moving the metal walls 84 closer to the waveguide structure. However, since some of the applied heat would be directed toward those walls, more heat must be applied when the walls are closer.

The inventors have noted that the phase shifter structure 60 can achieve a 10° C. change in the temperature of the region occupied by the 10 µm wavelength light with an applied heating power of 94 mW. Whereas for the regions occupied by the 3 µm or 1.5 µm wavelength light, a temperature change of 3° C. or 1° C. is achieved with only 24 mW or 8 mW of applied heat, respectively. Thus, a three-band phase shifter 60 of 0.5 cm length that separately cycles the phases of each of three wavelengths of light between 0 and 2π has a time-averaged power consumption and dissipation of 70 mW. The temperature change needed to achieve a 0 to 2 π change in the phase can be reduced by increasing the length of the phase shifter.

Figure 8D:
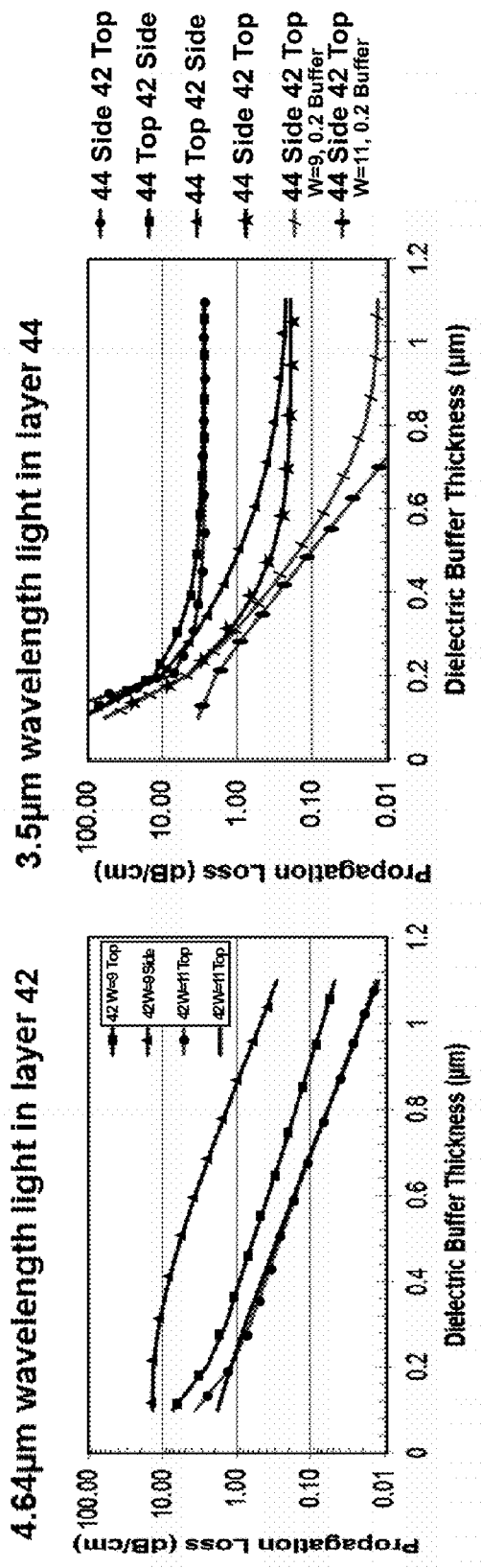
FIG. 8D shows results from an investigation on the preferred locations for the heater electrodes of layers 42 and 44 for an embodiment of the present disclosure such as illustrated in FIG. 6.

FIG. 8D shows results from an investigation on the preferred locations for the heater electrodes of layers 42 and 44 for an embodiment of the present disclosure such as illustrated in FIG. 6. Different combinations of locations of the electrodes 74 and 70 were tried on the top corners of layers 42 and 44 as well as on the sides of layers 42 and 44. According to an embodiment of the present disclosure, the heater electrode 62 for layer 46 can be placed above layer 52 and separated from the material of layer 52 (e.g. InP) by a 0.2 λm thick oxide buffer 64. Results for light at 4.64 µm and 3.5 µm wavelengths are shown in FIG. 8D. The propagation loss is plotted as a function of the dielectric buffer thickness. When the electrodes are placed at the sides of layer 42, optical simulations indicate that an oxide buffer whose thickness is at least 0.2 µm must be placed between the InP material of layer 42 and the metal electrodes in order to achieve reasonable loss 1 dB/cm) for the optical mode in that layer. If the oxide buffer is thinner, too much of the light would be absorbed by the metal electrodes. Also, if the oxide buffer is absent, plasmonic waveguide modes are excited at the interface between the outer edges of layers 42 and 44 and the metal electrodes.

For layer 44, the plot at the right of FIG. 8D shows that placing the heater electrodes for that layer at the sides of the layer gives lower optical loss for the 3.5 µm light than placing the heater electrodes at the top of that relatively thin layer. The optical loss for the 3.5 µm light also is affected by the placement of the electrodes which heat layer 42, since a small amount of that 3.5 µm light extends slightly into layer 42. To keep the optical loss below 1 dB/cm, there should be an oxide buffer of thickness ≥0.3 µm placed between the material of layer 3 and the metal electrodes for heating that layer.

Figure 8E:
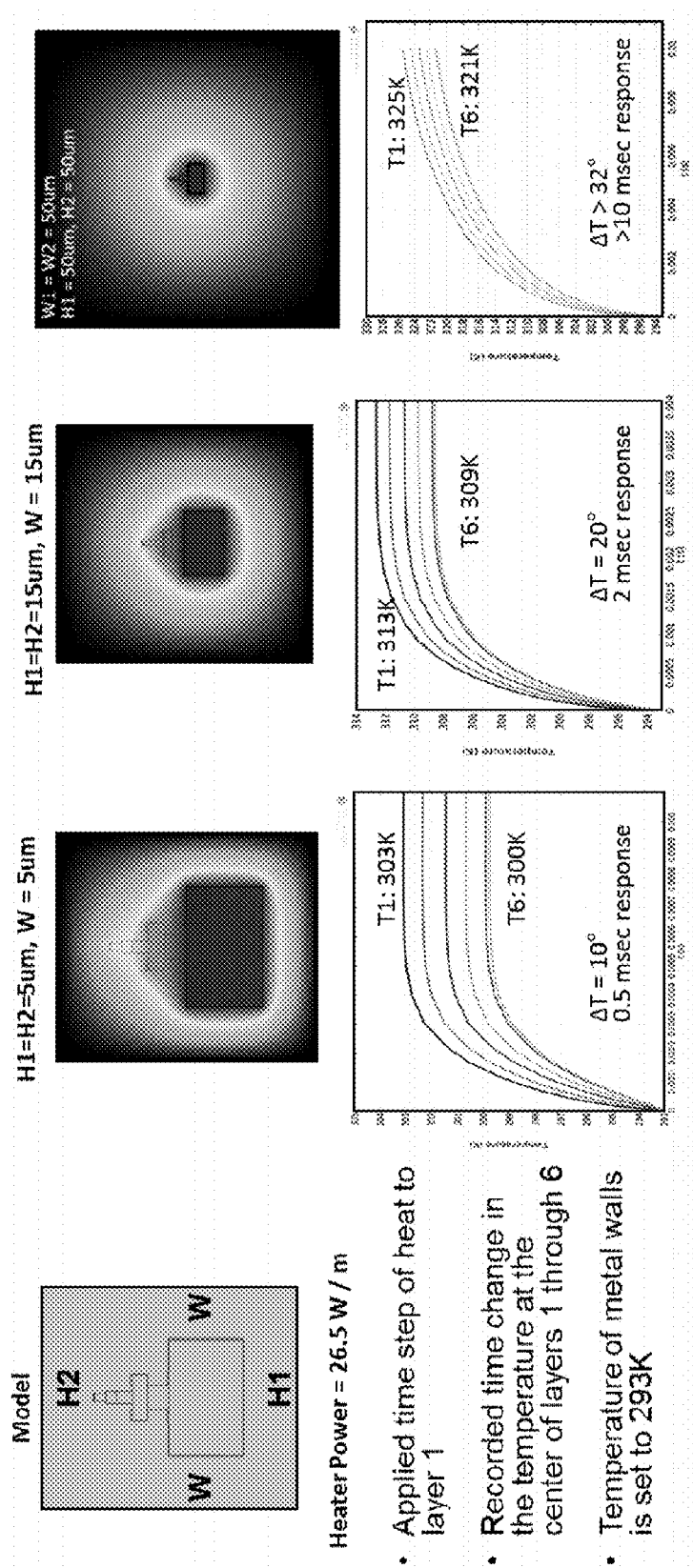
FIG. 8E shows results from an investigation of the effect of the separation distance between the walls 84 of the heat-sinking metal enclosure such as shown in FIG. 7.

FIG. 8E shows results from an investigation of the effect of the separation distance between the walls 84 of the heat-sinking metal enclosure such as shown in FIG. 7 and an optical shifter 60 such as shown in FIG. 6 but based on a 6 layers optical waveguide structure such as waveguide 40' of FIG. 4B instead of waveguide 40 of FIG. 4A. FIG. 8E illustrates examples for which the heat is applied through the two electrodes on layer 42. The rightmost part of FIG. 8E relates to a case for which the metal walls 84 are located very far from the phase shifter structure (e.g., the separation between those walls and any part of the phase shifter is 50 µm). This is illustrated in the temperature profile and time response shown on the right in FIG. 8E. The 6 curves shown in the time-response plots are for the temperature at the centers of the 6 layers (42, 43, 44, 45, 46 and 52) of the waveguide structure 40'.

With the distant heat sinking walls, the time response plotted for a pulse of applied heat shows that the temperature of the layers is still continuing to increase even after 10 msec from the start of the heating pulse. As the heat sinking walls are moved closer to the phase shifter structure, a steady-state temperature can be reached much faster (e.g. approximately 0.5 msec from the start of the heating pulse when the walls are 5 µm away from the outer edges of the multi-band waveguide structure, as shown in the leftmost curves of FIG. 8E). However, the fast response achieved by moving the heat-sinking walls close to the phase shifter structure comes at the cost of less efficient use of the applied heat to actually increase the temperature of the regions where the optical modes are.

According to an embodiment of the present disclosure, to achieve at least moderately efficient use of the heating power, at least 50 percent of the heater power can be conducted to the optical waveguide structure instead of to the heat sinking walls. For an ambient temperature of 293.15K and a maximum temperature in layer 1 (after 10 msec from the start of the heating pulse) of 325K, the steady state temperature of layer 42 can be chosen to be at least 310K. The middle curves of FIG. 8E show the results for a structure whose heat sinking walls are located 15 µm away from the optical waveguide. In such a case, layer 42 reaches a steady state temperature of 313K (a temperature change of 20 degrees) after approximately 2 milliseconds following the start of the heating pulse.

Figure 8F:
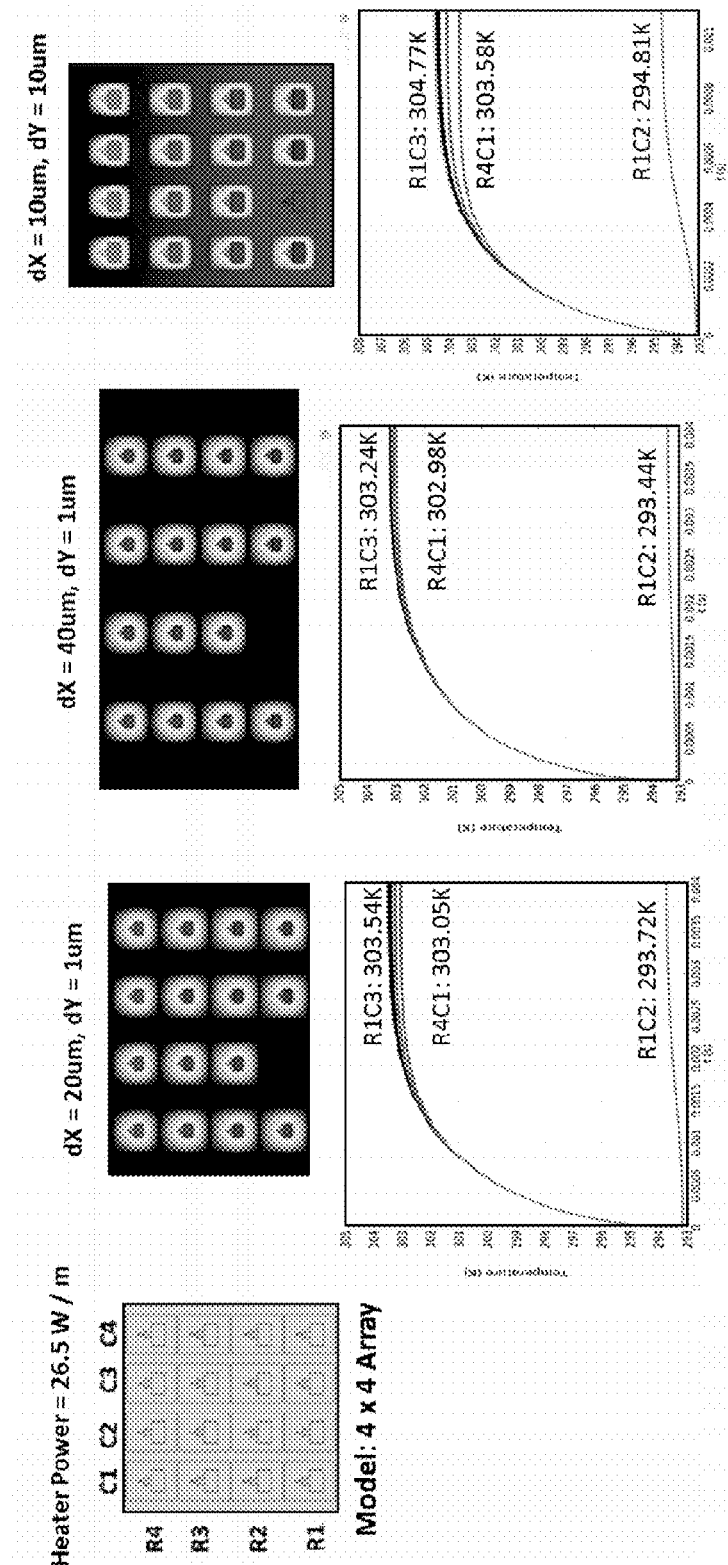
FIG. 8F illustrates the dependence of the element-to-element thermal crosstalk on the thickness of the metal heat-sinking walls 84 that surround the multi-band optical waveguides 60 such as illustrated in FIG. 7.

FIG. 8F shows results obtained from an analysis of the dependence of the element-to-element thermal crosstalk on the thickness of the metal heat-sinking walls 84 that surround the multi-band optical waveguides 60 such as illustrated in FIG. 7. A model of a 4×4 element array of waveguides 60 is shown in FIG. 8F. FIG. 8F shows the amount of temperature change that would result in a particular optical-phase controlling channel comprising a phase shifter 60 that is nominally turned off while all other surrounding channels/phase shifters 60 are turned on (i.e. heated in order to achieve a 10 degree temperature change). It was assumed that there is a perfect heat sink located on the top of the 2D array stack while the other 3 sides of the array are considered to be bounded by air.

The thickness (dX) of the wall between each column of channels as well as the thickness (dY) of the wall between each row of channels were varied. In the illustrated embodiment, since the heat removing sink is located at the top of the stack, it is primarily the vertical walls that serve to conduct the heat to that sink. Thus, the most effective heat sinking is achieved when dY is kept small, i.e. about 1 µm. This result has an additional benefit in that it means the spacing between the slices of a multi-slice assembled two-axis phased array can be smaller. In the horizontal dimension, the results indicate that a wall thickness of dX=40 µm or more is needed in order to provide effective conduction of the heat generated in the phase shifter waveguide through those vertical walls to a heat sink (not shown) located at the top of the overall structure. The need to keep the temperature change of layer 1 from thermal crosstalk below 3% of the temperature change used to achieve a 2π phase shift of the light in that layer (i.e., with the temperature remaining below 293.45K when the heater for that channel is not switched on, since the temperature change of a heated channel is approximately 10K) was set as a design constraint. Incidentally, for this 40 µm wall thickness, the variation between the temperatures of the heated channels also is less than 0.3K.

According to an embodiment of the present disclosure, the metal enclosures 84 around the phase shifters 60 are used not only to conduct heat to the heat sink but also to conduct electrical current to the individual heater strips that are on the waveguide phase shifters 60. Thus, according to an embodiment of the present disclosure, the vertical walls 84 of the enclosure can be separated into discrete posts that are electrically isolated from each other, with a post conducting the current to a segment of heater electrode and a companion post conducting current from that segment of heater electrode back to the temperature controller and heater driver circuit. Each 3-band phase shifter 60 can then have 5 heater electrode segments, with two heater segments for layer 42, two heater segments for layer 44 and one heater segment for layer 46. Thus, each phase shifter 60 would need 10 posts for conducting the heater currents of that phase shifter. Essentially, each thermally conducting vertical wall of the enclosure can then consist of posts separated by gaps. The gaps between the posts essentially act to reduce the thermal conductivity of the vertical walls. A gap of only 5-10 µm is more than sufficient to provide electrical isolation between adjacent posts. Simulation has shown that even with these gaps (10 µm gap width between 40 µm×40 µm size posts), the thermal crosstalk remains below 3%, as desired.

Another design example, discussed next, illustrates how one can select the desired resistance (and thus the composition width and thickness) of the heater electrodes. In order for a 1 cm length phase shifter to produce a phase shift of 2π for light of 4.64 µm wavelength, the InP material of layer 1 should undergo a temperature change of 2.8 degrees. According to an embodiment of the present disclosure, each of the two heater strips on layer 42 of the waveguide structure would need to produce 37.1 mW of resistive heat to produce this temperature change. Assuming that the electrical heater currents for the electrodes are supplied by a controller interface card, each output channel of such interface card can source a maximum of 10 Volts at a maximum current of 5 mA. As an example, the interface card can be set to produce an output voltage of 8 Volts when a phase shift of 2π is desired, and the resistance of the heater should be 1725 Ohms (for a heater length of 1 cm). The corresponding heater current at which this 2π phase shift would be obtained is 4.64 mA.

Figure 9:
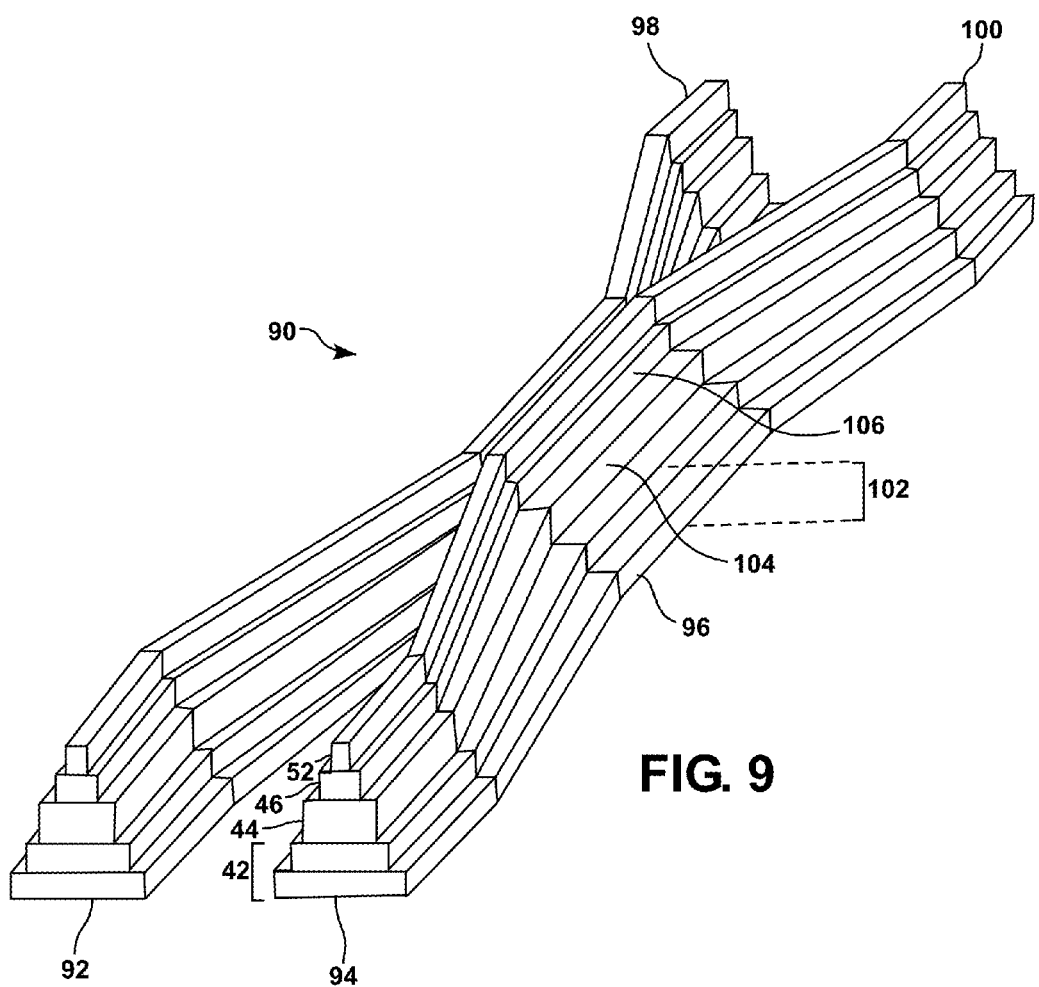
FIG. 9 is an elevation view of an optical coupler according to an embodiment of the present disclosure.

FIG. 9 is an elevation view of an optical coupler 90 according to an embodiment of the present disclosure. According to an embodiment of the present disclosure, optical coupler 90 comprises first and second photonic waveguides 92, 94 each for example identical to the photonic waveguide 40 of FIG. 4A or to the photonic waveguide of the phase shifter 60 of FIG. 6. According to an embodiment of the present disclosure, end portions of each strip of light conducting semiconductor materials of the first and second photonic waveguides 92, 94 join laterally to form respectively left and right sides of a first end of a coupling portion 96.

According to an embodiment of the present disclosure, optical coupler 90 further comprises third and fourth photonic waveguides 98, 100, for example identical to the photonic waveguides 92, 94. According to an embodiment of the present disclosure, end portions of each strip of light conducting semiconductor materials of the third and fourth photonic waveguides 98, 100 join laterally to form respectively left and right sides of a second end of coupling portion 96, axially opposed to the first end of coupling portion 96. According to an embodiment of the present disclosure, photonic waveguides 92, 94 form first and second input waveguides of optical coupler 90 and photonic waveguides 98, 100 form first and second output waveguides of optical coupler 90.

Thus, coupling portion 96 comprises a combination of three pairs of strips of light conducting semiconductor material of decreasing width (42-42; 44-44 and 46-46) wherein the facing sides of the strips of each pair are coupled together. The three superposed coupled pairs of strips can further be coupled vertically to each other. It follows that the coupling portion 96 has a stepped pyramidal cross-section with a bottom stage 102 wider than the width of strip 42, a middle stage 104 wider than the width of strip 44 and a top stage 106 wider than the width of strip 42. According to an embodiment of the present disclosure, if the first strip 42 of the photonic waveguides coupled to form coupling portion 96 comprise a first strip 48 below a narrower strip 50, then bottom stage 102 of coupling section 96 can comprise a first strip 108 wider than the width of strip 48, below a strip 110 wider than the width of strip 50.

According to an embodiment of the present disclosure, the width and height of the bottom stage strip 102 of the coupling portion are such that strip 102 can confine an antisymmetric higher-order wave-guided mode of the light of largest wavelength λ3 in addition to the symmetric lowest-order or fundamental wave-guided mode for that wavelength. Similarly, the width and height of the middle stage strip 104 of the coupling portion are such that strip 104 can confine both an antisymmetric higher-order and a symmetric fundamental wave-guided mode of the light of medium wavelength λ2; and the width and height of the top stage strip 106 of the coupling portion are such that strip 106 can confine both an antisymmetric higher-order and a symmetric fundamental wave-guided mode of the light of shortest wavelength λ1. The coupling portion 96 can thus support both the symmetrical fundamental mode and the antisymmetric first-order mode for each of the wavelengths λ1, λ2 and λ3.

Figure 10:
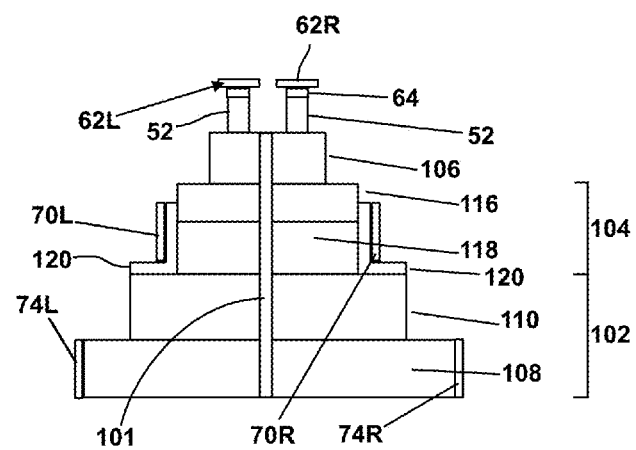
FIG. 10 is a cross section of the optical coupler of FIG. 11.

FIG. 10 shows a cross section of the coupling portion 96 of coupler 90. According to an embodiment of the present disclosure, the materials comprising coupling portion 96 can be essentially the same as the materials comprising phase shifter 60 as described previously in relation to FIG. 6. Top strip 46 can be a layer of thermo optic material; for example GaInAsP. According to an embodiment of the present disclosure, a narrow strip of material having a low refractive index 52 is located on top of each strip 46 of the pair of strips forming the top strip 106 of coupler 90. According to an embodiment of the present disclosure, temperature control elements 62L and 62R are arranged respectively on top of the two narrow strips 52, for controllably changing the temperature respectively of the left and right portions of the top strip 106 of coupling portion 96. According to an embodiment of the present disclosure, control elements 62L and 62R can each have the same structure as the control element 62 of phase shifter 60. According to an embodiment of the present disclosure, control elements 62L and 62R can each comprise a heater such as resistor heater strip, for example of metal or polysilicon, arranged on top of a refractory layer 64, for example of Si3N4, itself arranged on top of strip 52. According to an embodiment of the present disclosure, strip 52 can be have a very high thermal conductivity, and can for example be comprised of InP. According to an embodiment of the present disclosure, coupling portion 96 can further comprise a heat conductor (for example similar to walls 84 of FIG. 7) capable of evacuating the heat produced by the heaters.

According to an embodiment of the present disclosure, strip 104 can comprise two layers/strips of thermo optic materials 116, 118 of same width, superposed/coupled on top of each other. According to an embodiment of the present disclosure, strip 116 can be an alternated succession of thin sub-layers of two materials; for example GaInAsP and InAlAs. According to an embodiment of the present disclosure, the thickness of each sub-layer can be less than 0.1 µm. According to an embodiment of the present disclosure, strip 118 can be made of GaInAsP. According to an embodiment of the present disclosure, the refractive index of strip 104 can be calculated globally for strips 116 and 118.

According to an embodiment of the present disclosure, optical coupler 60 comprises two temperature control element 70L and 70R for controllably changing the temperature of respectively the left side and the right side of the thermo-optic material of strip 104. According to an embodiment of the present disclosure, control elements 70L and 70R each comprise a heater such as a pair of resistor heater strips, for example of metal or polysilicon, arranged respectively on the left and right sides of strip 104. According to an embodiment of the present disclosure, the heater can be isolated from the sides of strip 104 (as well as from the top of strip 102) by a dielectric layer 120, for example of $Si_3N_4$.

According to an embodiment of the present disclosure, strip 110 can be an alternated succession of thin sub-layers of two materials; for example GaInAsP and InAlAs. According to an embodiment of the present disclosure the thickness of each of the sub-layers can be less than 0.1 µm. According to an embodiment of the present disclosure, strip 108 can be made of InP. According to an embodiment of the present disclosure, the refractive index of strip 102 can be calculated globally for strips 110 and 108.

According to an embodiment of the present disclosure, optical coupler 90 comprises two temperature control elements 74L and 74R for controllably changing the temperature respectively of the left side and the right side of the thermo-optic material of strip 102. According to an embodiment of the present disclosure, control elements 74L and 74R comprise a heater such as a pair of resistor heater strips, for example of metal or polysilicon, arranged respectively on the left and right sides of strip 108.

In some embodiments, a groove 101 is etched through the optical coupler structure 90, with the groove penetrating through multiple layers or strips. The groove preferably is filled with a material such as $Si_3N_4$ that has relatively high optical refractive index (compared to the refractive index of the materials comprising the strips) but relatively low thermal conductivity (compared to the thermal conductivity of the materials comprising the strips). The groove 101 may extend partially or completely through layers 106, 116, 118, 110 and 108 of the structure. In some embodiments, the width of the groove preferably has a sufficiently small value, e.g., between 0.2 µm and 2 µm, such that light of wavelengths λ1, λ2 and λ3 in the regions on the left side and on the right side of the groove can couple together. The presence of the groove and the low thermal conductivity of the material filling the groove provide some measure of thermal isolation between the regions to the left and to the right of the groove.

According to an embodiment of the present disclosure, the strips of the optical coupler 90 preferably are fabricated from an III-V semiconductor material system such as GaAs/GaAlAs, GaInAlAs/InAlAs/InP, or GaInAsP/InP, as described above for optical phase shifter 60.

According to an embodiment of the present disclosure, controllably changing the temperature of the left side or the right side of the thermo-optic material of any of the strips 102, 104, 106 of the coupling portion 96 allows controllably changing the refractive index of the left side or the right side of the strip, which allows directing a controlled percentage of the light received by the strip through waveguides 92, 94 toward its right side or left side. Light directed toward the left side exits from the coupler through waveguide 98, whereas light directed toward the right side exits from the coupler through waveguide 100.

Thus, coupler 90 allows receiving λ1, λ2 and λ3 lights from waveguides 92 and/or 94, and independently controlling which portions of the received λ1, λ2 and λ3 lights exit from coupler 90 via waveguide 98 and which portions exit from coupler 90 via waveguide 100.

According to an embodiment of the present disclosure, the width of each strip of the coupling portion 96 is such that the λ1, λ2 and λ3 lights received by the strip through waveguides 92, 94 is divided equally between waveguides 98 and 100.

For example, light λ3 can be LWIR light and the width of strip 102 of coupling section 96 is selected such that LWIR light supplied by waveguide 92 or 94 is divided equally between waveguides 98 and 100. Heating currents can be applied to the two electrodes 74L and 74R to adjust the relative amounts of LWIR light output from waveguides 98 and 100.

For another example, in the case λ2 is MWIR light, the coupling of MWIR light can be similar to that of the LWIR light, but the heating currents that control the coupling of the MWIR light is applied to heater electrodes 70L or 70R. It is noted that for the same length of the coupling section 96, the MWIR light supplied by for example waveguide 92 will be coupled into waveguide 100. However, heating current can be applied to either heater 70L or heater 70R to disrupt that coupling and reduce the amount of MWIR light coupled into waveguide 100, which increases the amount of MWIR light coupled into waveguide 98.

In the case λ1 is SWIR light, the coupling of SWIR light can be similar to that of the MWIR light, for the above example, but the heating currents that control the coupling of the SWIR light is applied to heater electrodes 62L or 62R.

Figure 11:
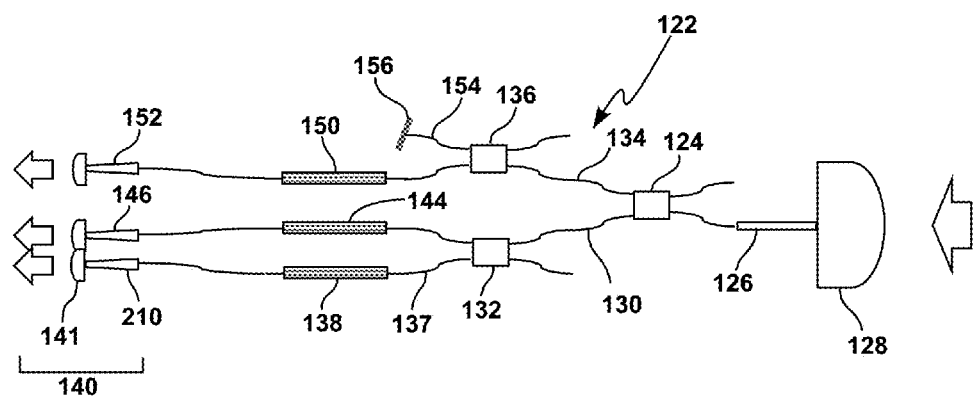
FIG. 11 illustrates a portion of a phased array comprising photonic waveguides as shown in FIG. 4A or B, optical phase shifters as shown in FIG. 6 and optical couplers as shown in FIGS. 9-10.

FIG. 11 illustrates a portion of a phased array 122 according to an embodiment of the present disclosure, comprising a first optical coupler 124 such as shown in FIG. 9, having an input extending into an input waveguide segment 126 such as the tapered structure shown in FIG. 5C having an end coupled to an input focusing lens 128. According to an embodiment of the present disclosure, the second input of coupler 124 can be arranged such that no light enters the second input. According to an embodiment of the present disclosure, a first output 130 of optical coupler 124 is coupled to the input of a second optical coupler 132 such as shown in FIG. 9 and a second output 134 of optical coupler 124 is coupled to the input of a third optical coupler 136 such as shown in FIG. 9.

According to an embodiment of the present disclosure, a first output 137 of coupler 132 is coupled to an optical phase shifter 138 such as shown in FIG. 6, the output of which is coupled to a light emitter structure 140. According to an embodiment of the present disclosure, light emitter structure 140 can comprise a metal-walled waveguide taper 210 such as described hereafter, coupled in output to a divergent lens 141. According to an embodiment of the present disclosure, a second output 142 of coupler 132 is coupled to an optical phase shifter 144 such as shown in FIG. 6, the output of which is coupled to a light emitter structure 146. According to an embodiment of the present disclosure, a first output 148 of coupler 136 is coupled to an optical phase shifter 150 such as shown in FIG. 6, the output of which is coupled to a light emitter structure 152. According to an embodiment of the present disclosure, the second output 154 of coupler 136 is coupled to a light absorber 156. The electrical connection to the control elements of the optical phase shifters and optical couplers of FIG. 11 are not shown for clarity. The portions of coupling waveguides can be straight or curved in the plane comprising phased array 122.

According to an embodiment of the present disclosure, a multi-band input light is input through lens 128. According to an embodiment of the present disclosure, one way to adjust the amplitudes of the light emitted by the emitter structures 140, 146 and 152 is to adjust the amplitudes of the light coupled into each of the phase shifters 138, 144, 150. This can be done by controlling couplers 124, 132 and 136, whereby the different phase shifters have different amounts of light coupled into them. According to an embodiment of the present disclosure, the combination of the light couplers and the phase shifters provides the desired amplitude and phase control for the light emitted from the output emitter apertures. According to an embodiment of the present disclosure, the cascade of optical couplers 124, 132, 136 forms a 1×3 optical coupler. According to an embodiment of the present disclosure, an output of the cascade of optical couplers 124, 132, 136 is coupled to a light absorber, which allows coupling no light to the phase shifters if desired; or allows controlled attenuation of the total amount of remaining light coupled into the three phase shifters connected to that cascade of optical couplers.

According to an embodiment of the present disclosure phased array 122, when seen in a cross section through phase shifters 138, 144, 150, looks as exemplary array 80 of FIG. 7. We will now consider an exemplary array 80/122 comprising 10,000 phase shifters, arranged along 40 rows having each 250 phase shifters 60 of 2 cm of length. Each phase shifter 60 is in a metal enclosure 84 of 40 µm of width, so that each row of phase shifters occupies an area of 1 cm×2 cm (width and length). Each row of phase shifters has an average power dissipation of 17.5 mW and the full array of phase shifters has a total average heat generation of 175 W and requires an average power dissipation of approximately 87.5 W/cm$^2$. If the array 80/122 also has 10,000 amplitude adjusting two-mode couplers 90 that, as a worst case, likewise generate 17.5 mW of heat per coupler, the total heat generation for the 10,000 element array would be 350 W. Assuming that the couplers have approximately the same length as the phase shifters, the required power dissipation by the coolers still would be 87.5 W/cm$^2$ since the surface area over which the heat is removed would be doubled. As a point of comparison, the power dissipation of an Intel Core i7 processor is 130 W/cm$^2$. This amount of heat can be removed by various commercially available means. For smaller arrays, the heat can be removed by low-cost computer-CPU coolers. The CPU coolers have a maximum cooling capacity of 200-300 W.

Figures 12, 13:
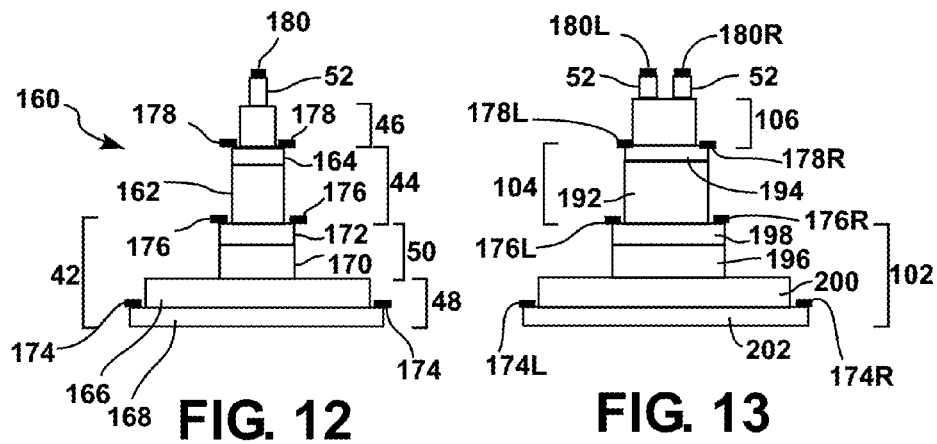
FIG. 12 shows a cross section of an optical phase shifter according to an embodiment of the present disclosure.
FIG. 13 shows a cross section of an optical coupler according to an embodiment of the present disclosure.

FIG. 12 shows a cross section of an optical phase shifter 160 according to an embodiment of the present disclosure, based on an optical waveguide 40 as shown in FIG. 4A. According to an embodiment of the present disclosure, the strips 42, 44, 46 and 52 of phase shifter 160 are fabricated from an electro-optic III-V semiconductor material system such as GaAs/GaAlAs, GaInAlAs/InAlAs/InP, or GaInAsP/InP that provides a variety of materials that have different optical refractive index but that have the same lattice constant. According to an embodiment of the present disclosure, strip 44 comprises a layer of electro-optic material 162, preferably un-doped or un-intentionally doped, the top of which is covered by a layer of N-doped material 164 of same width.

According to an embodiment of the present disclosure, strip of light conducting semiconductor material 42 can be comprised of two or more strips 48, 50 of different materials having different refractive indexes and different widths, wherein strip 48 can comprise a layer of electro-optic material 166, preferably un-doped or un-intentionally doped, on top of a layer of N-doped material 168. According to an embodiment of the present disclosure, layer 168 can be slightly wider than layer 166, thus adding a step to the pyramidal cross-section of phase shifter 160. According to an embodiment of the present disclosure, strip 50 comprises a layer of electro-optic material 170, preferably un-doped or un-intentionally doped, the top of which is covered by a layer of P-doped material 172 of same width.

According to an embodiment of the present disclosure, strip 46 comprises a layer of electro-optic material, preferably un-doped or un-intentionally doped. According to an embodiment of the present disclosure, narrow strip of light conducting semiconductor material 52, on top of and narrower than light conducting strip 46, comprises a layer of P-doped material.

According to an embodiment of the present disclosure, the sandwiching of un-doped or un-intentionally doped layers 166, 170, 162 and 46 between P-doped and N-doped layers 168, 172, 164, 52, forms PIN diodes. According to an embodiment of the present disclosure, the I-layers 166, 170, 162 and 46 preferably have low background carrier concentration so that they can be depleted of free carriers by applying a small reverse bias voltage to their associated PIN diode. According to an embodiment of the present disclosure, changing the bias voltage applied across an I-layer changes the optical refractive index of its electro-optic material. The change in the phase shift of the light is proportional to $\Delta n \cdot L/\lambda$, where $\Delta n$ is the refractive index change, L is the length of the phase shifter and $\lambda$ is the optical wavelength.

According to an embodiment of the present disclosure, each of the P-doped and N-doped layers 168, 172, 164 and 52 comprises at least an electrode, respectively 172, 176, 178 and 180. Changing the voltage applied across electrodes 180 and 178 will change the phase shift of the $\lambda 1$ light (for example SWIR light); changing the voltage applied across electrodes 178 and 176 will change the phase shift of the $\lambda 2$ light (for example MWIR light); and changing the voltage applied across electrodes 176 and 174 will change the phase shift of the $\lambda 3$ light (for example LWIR light). The voltage results in an electric field applied to the electro-optic material, whose refractive index is affected by the electric field.

According to an embodiment of the present disclosure, the electrode pairs 180-178; 178-176 and 176-174, by allowing to controllably change the refractive index of the material of layers 46, 162 and 170-166, allow controlling the phase of the $\lambda 1$, $\lambda 2$ and $\lambda 3$ lights propagating through these layers. Changing the refractive index of the material changes the phase velocity of the light that passes through the material, and thus allows changing the phase of the light output by the phase shifter.

FIG. 13 shows a cross section of the coupling portion of an optical coupler 190 according to an embodiment of the present disclosure. Optical coupler 190 comprises a first strip 102 provided for confining side-by-side two-waveguided modes of the light of largest wavelength $\lambda 3$; a second strip 104 provided for confining side-by-side two-waveguided modes of the light of largest wavelength $\lambda 2$ and a first strip 104 provided for confining side-by-side two-waveguided modes of the light of largest wavelength $\lambda 1$.

According to an embodiment of the present disclosure, strip 106 can be an undoped or unintentionally doped layer, where each half of strip 106 is covered by a centered narrow strip 52 of P-doped material. Strip 104 can comprise an undoped or unintentionally doped layer 192 covered by a N-doped layer 194. Strip 102 can be formed of an undoped or unintentionally doped layer 196 covered by a P-doped layer 198 of same width, on top of an undoped or unintentionally doped layer 200 of greater width, itself on top of a N-doped layer 202 of greater width.

According to an embodiment of the present disclosure, the left and right narrow strips 52 comprise electrodes 180L, 180R, respectively; the left and right sides of layer 194 comprise electrodes 178L, 178R, respectively; the left and right sides of layer 198 comprise electrodes 176L, 176R, respectively; and the left and right sides of layer 202 comprise electrodes 174L, 174R, respectively.

According to an embodiment of the present disclosure, the left and right electrode pairs 180L-178L and 180R-178R; 178L-176L and 178R-176R; 176L-174L and 176R-174R, by allowing to controllably change the refractive index of the material of the left and right portions of layers 106, 192 and 196-200, allow directing the $\lambda 1$, $\lambda 2$ and $\lambda 3$ lights propagating through these layers to the left or the right of this layers, and thus to the left or right output waveguides of these layers.

Figure 14:
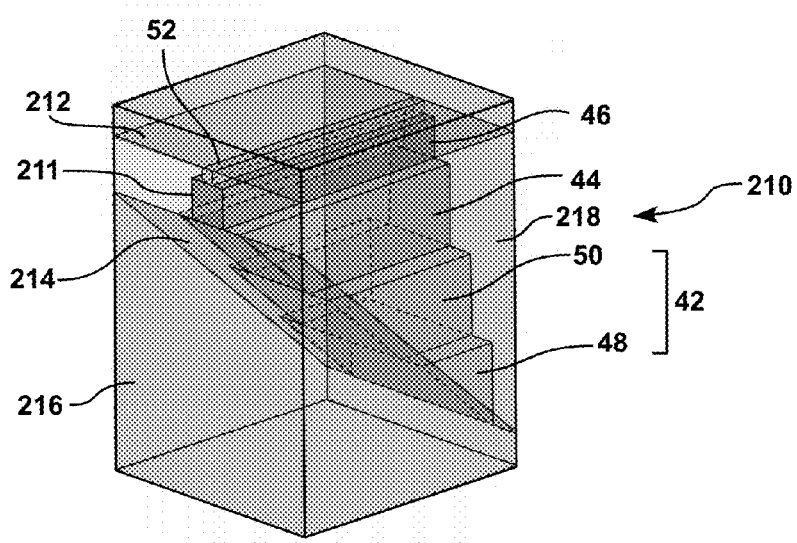
FIG. 14 is an elevation view of a portion of a light emitter according to an embodiment of the present disclosure.

FIG. 14 is an elevation view of a waveguide taper 210 of a light emitter according to an embodiment of the present disclosure. According to an embodiment of the present disclosure, waveguide taper 210 is formed at an end of a waveguide such as waveguide 40 of FIG. 4A, comprising strips 42, 44, 46 and 52. According to an embodiment of the present disclosure, an output end of waveguide taper 210 is formed by an end 211 of the strip 46, preferably perpendicular to the axis of the waveguide. According to an embodiment of the present disclosure, end 211 of strip 46 is located on an edge of the substrate in which waveguide 40 was manufactured. According to an embodiment of the present disclosure, a lens (not shown in FIG. 14) such as divergent lens 141 of FIG. 11 is coupled to the output end 211 of waveguide taper 210.

Figure 15:
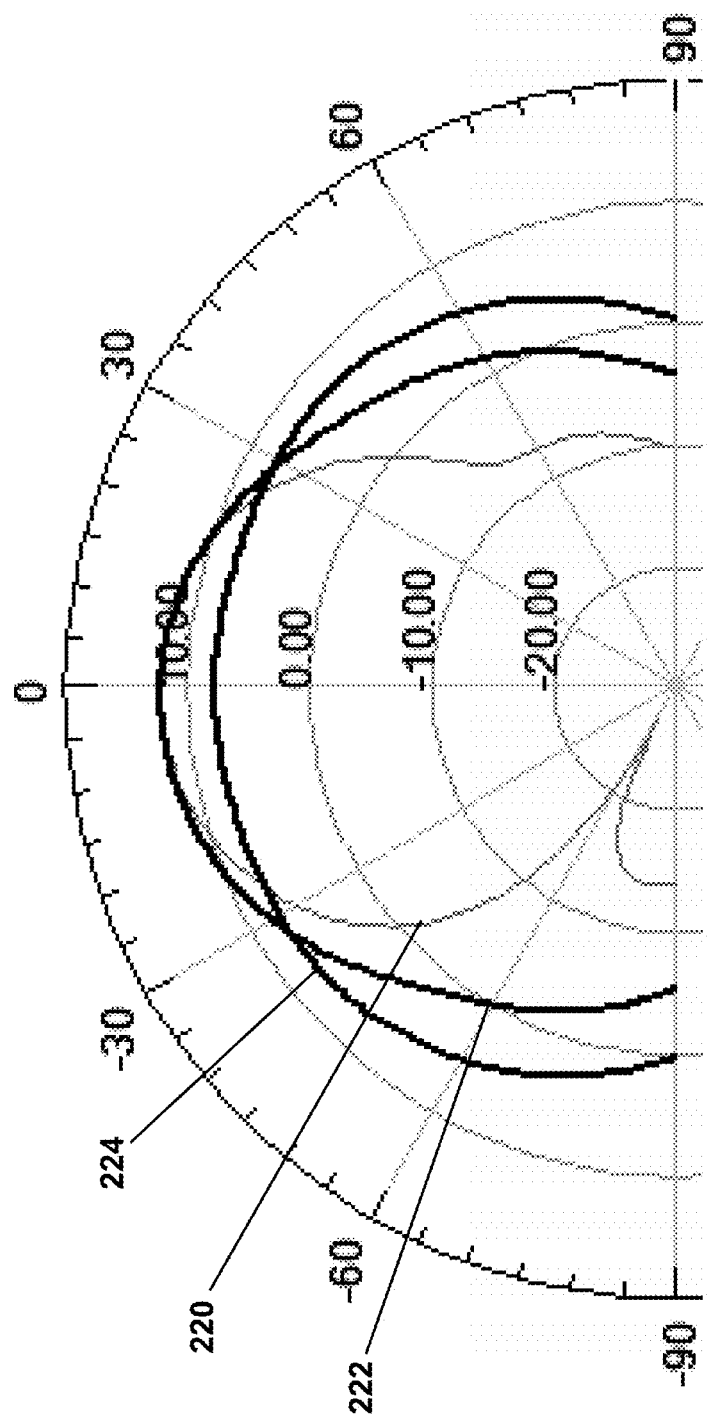
FIG. 15 is a radiation pattern of an exemplary output end of the light emitter of FIG. 14.

According to an embodiment of the present disclosure, waveguide taper 210 has a metal wall on all 4 sides (or on at least 3 sides) of the structure, comprising an upper metal wall 212, a lower metal wall 214 and lateral metal walls 216, 218. According to an embodiment of the present disclosure, the metal-walled tapers are designed to compress the size of the $\lambda 3$ light (e.g. LWIR) optical modes in order to increase the divergence of the $\lambda 3$ light emitted at the waveguide ends. The inventors have noted that at longer wavelengths, insertion loss from metal absorption is tolerable. At the start of the taper, the walls are located far from each other and sufficiently far from the stepped pyramid structure that the $\lambda 3$ light optical mode has negligible overlap with those walls, as illustrated in FIG. 15 hereafter. The walls are then moved gradually closer to each other as the taper progresses. The wall on the side near the bottom of the stacked pyramid is moved more rapidly than the wall on the side near the top of the pyramid. The walls on the sides of the pyramids are moved toward each other in a more symmetric manner. At the end of the taper, the 4 walls are preferably centered on the axis of the strip 42, and thus on the axis of the $\lambda 1$ light optical mode, near the top of the pyramid structure of waveguide 40.

According to an embodiment of the present disclosure, the metal-walled taper is intended to have a strong effect on the $\lambda 3$ light mode but only minimal effect on the $\lambda 1$ light mode (and reduced effect on the $\lambda 2$ light mode). The taper also has some effect on light of intermediate wavelengths. As an example, simulations made by the inventors showed that an exemplary taper can achieve an emitter-determined 3-dB beamwidth of 129° for 9 µm wavelength light, compared to a beamwidth of only 42° for a waveguide without a taper (see FIG. 15). According to an embodiment of the present disclosure, more than 90% of a 9 µm wavelength light is transmitted through taper 210. For the $\lambda 1$ light, in case it is SWIR light, whose mode size already is smaller than the 2 µm width and height of the output end of the exemplary taper, the taper has only a minimal effect. Besides compressing the optical modes of the λ3 light and λ2 light (for example LWIR and MWIR2 light), taper 210 also moves the location of the λ3 and λ2 light modes so that all 3 wavelength bands are emitted from a same region 211 surrounded by the walls of the taper. Although FIG. 14 only depicts a taper along the y-axis, there also is a taper along the x-axis, as discussed above. According to an embodiment of the present disclosure, the material of the metal walls is selected to minimize the absorption loss from the metal. For most wavelengths, silver (Ag) is a suitable low-loss material for the walls of the taper. The metal-walled taper also provides optical isolation between adjacent emitters, permitting those emitters to be spaced as closely as 2.5 μm apart in the lateral direction (i.e., along the x axis). The emitter spacing along the y axis is not limited by the size of the end of the metal-walled taper but rather by the size of the taper at the beginning of that structure. Thus, the emitter spacing along the y axis generally is at least 10-15 μm.

FIG. 15 is a radiation pattern of an exemplary output end of waveguide taper 210 according to an embodiment of the present disclosure, showing a radiation pattern 220 for a λ3 light of 9 μm with no metal taper, and a radiation pattern 222 for the same light with the metal taper. Pattern 220 corresponds to a beamwidth (3 dB) of 42°, whereas pattern 222 corresponds to a beamwidth of 129°. FIG. 15 also shows a radiation pattern 224 for a λ1 light of 1.5 μm with the metal taper, which corresponds to a beamwidth of 50°.

According to an embodiment of the present disclosure, the lens 141 coupled to the output 211 of taper 210 is arranged to enlarge the element-determined beam width of the λ1 light (e.g. SWIR light or MWIR1 light) and also somewhat enlarges the beam width of the λ2 light (e.g. MWIR2 light). For example, lens 141 can be a divergent lens that has a concave curvature and sub-focal-length spacing between the lens surface and the end 211 of the metal-walled waveguide taper that are designed to efficiently achieve the desired wide element pattern for the λ1 light. The axis of the lens can be aligned with the common axis of the λ1, λ2 and λ3 lights (e.g. SWIR, MWIR1 or MWIR2 and LWIR) modes at the end 211 of the taper. The size of the lens 141 and the distance between its curved surface and the taper end generally is too small for the lens to significantly affect the element-determined beam width for the λ3 light (e.g. LWIR light). Thus, the lens affects primarily the λ1 and λ2 lights (e.g. SWIR and MWIR1 lights). The region between the taper end 211 and the lens surface can be filled with a semiconductor material whose refractive index is similar to that for the material of the multi-band optical waveguide, such as GaAs and InP.

According to an embodiment of the present disclosure, the combination of a lens 141 at the output 211 of the metal-walled tapers following the phase shifters and straight or S-curve waveguides reduces the effective emitter sizes for each spectral band and achieves radiation-element limited beam divergence >120° for all wavelengths.

Figure 16:
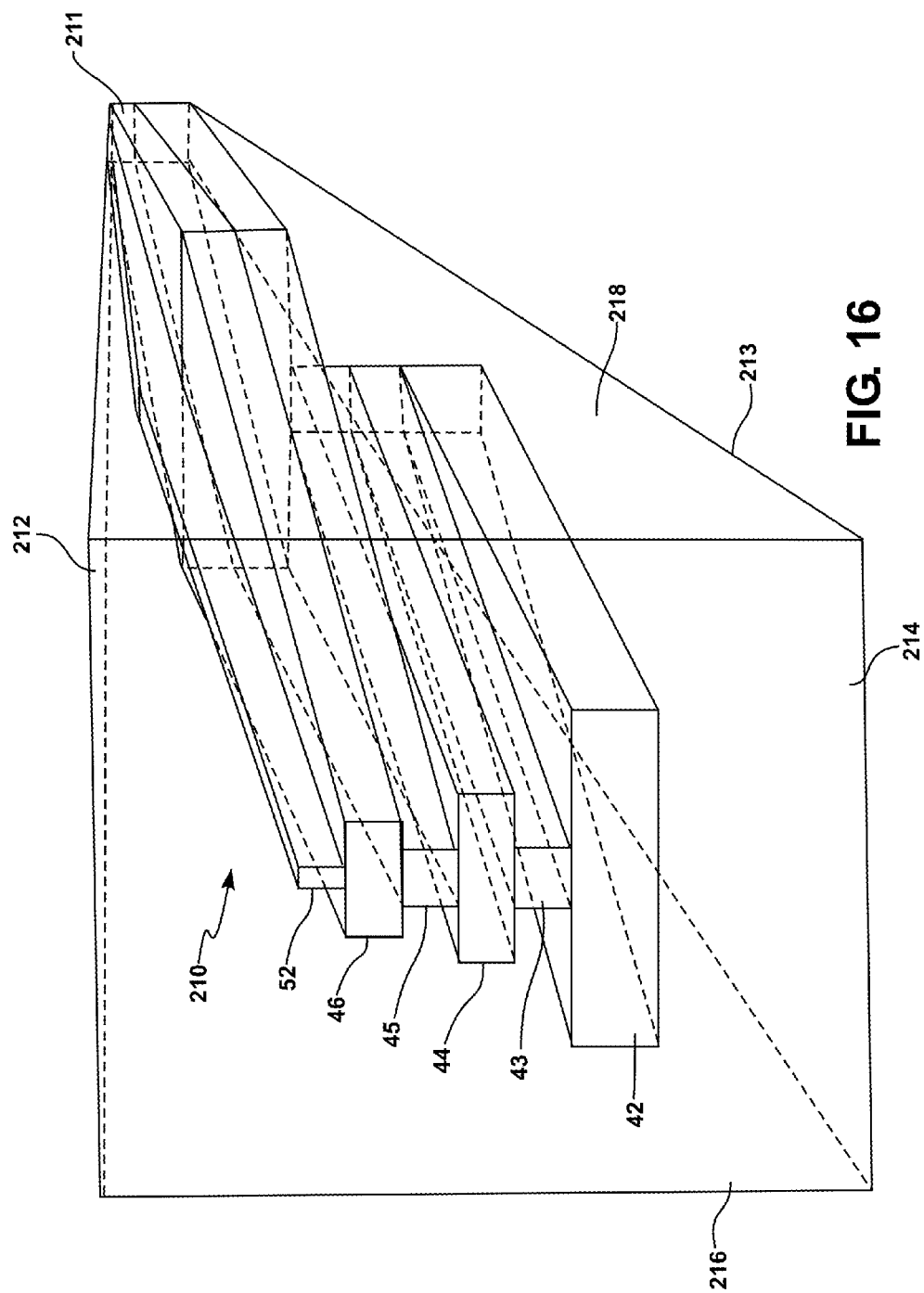
FIG. 16 is an elevation view of a light emitter according to an embodiment of the present disclosure.

FIG. 16 is an elevation view of a waveguide taper 210 of a light emitter according to another embodiment of the present disclosure, where waveguide taper 210 is formed at an end of a waveguide such as waveguide 40' of FIG. 4B, comprising strips 42, 44, 46 and 52 and intermediate strips 43 and 45, respectively between strips 42, 44 and strips 44, 46. According to an embodiment of the present disclosure, an output end of waveguide taper 210 is formed by an end 211 of the strips 46 and 45, preferably perpendicular to the axis of the waveguide. According to an embodiment of the present disclosure, end 211 of strip 46 is located on an edge of the substrate in which waveguide 40' was manufactured.

According to an embodiment of the present disclosure, a lens (not shown in FIG. 16) such as divergent lens 141 of FIG. 11 is coupled to the output end 211 of waveguide taper 210.

According to an embodiment of the present disclosure, waveguide taper 210 is located within a metal taper 213, illustrated in FIG. 16 as a truncated metallic pyramid the top of which is output end 211, comprising an upper metal wall 212, a lower metal wall 214 and lateral metal walls 216, 218.

According to an embodiment of the present disclosure, waveguide taper/optical emitter 210 comprises an input section, an inner section and an output section. In the input section, the width and height of strips 42, 43, 44, 45, 46 and 52 are the same as those of the strips of same reference in superposed of the photonic waveguide 40' to which it is coupled. From the input section to the inner section of waveguide taper/optical emitter 210, the width of strips 45 and 46 is gradually enlarged so that strips 45 and 46 become adapted to confine an optical mode of all of the wavelengths λ1, λ2, λ3. Also, from the input section to the inner section of waveguide taper/optical emitter 210, the width of strips 42, 43 and 44 is gradually reduced so that strips 42, 43 and 44 become unable to confine an optical mode of any of the wavelengths λ1, λ2, λ3. Thus, between the input and inner sections of waveguide taper/optical emitter 210, all the light propagating in waveguide 40' is squeezed up into an enlarged section of strips 45 and 46.

According to an embodiment of the present disclosure, from the inner section to the output section of waveguide taper/optical emitter 210, the width of strips 45 and 46 is gradually reduced so that the width and height of the emitter end surface 211 is too narrow to confine an optical mode of any of the wavelengths λ1, λ2, λ3. The width and length of the emitter end surface 211 can be chosen as disclosed previously in relation with FIG. 14, to increase the divergence of at least one of the lights output by emitter end surface 211.

According to an embodiment of the present disclosure, the output section of waveguide taper/optical emitter 210 can be devoid of strips 42, 43 and 44. Because the light was squeezed out from strips 42, 43 and 44 between the input and inner sections of waveguide taper/optical emitter 210, strips 42, 43 and 44 can be suppressed from the output section.

According to an embodiment of the present disclosure, the space between metallic taper 213 and waveguide taper/optical emitter 210 can be filled with a material having a low refractive index.

According to an embodiment of the present disclosure, the lateral walls of strips 45, 46 between the inner and output sections of waveguide taper/optical emitter 210 can follow the lateral walls 216, 218 of metallic taper 213. According to an embodiment of the present disclosure, at least in the output section of waveguide taper/optical emitter 210, strip 52 can be canceled or reduced to a null height such that the end of the top walls of strip 46 in the output section of waveguide taper/optical emitter 210 can follow the top wall 212 of metallic taper 213.

According to an embodiment of the present disclosure, bottom wall 214 of metallic taper 213 is optional.

According to an embodiment of the present disclosure, metallic taper 213 can be coupled to metal walls 84 of FIG. 7.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

For example, FIGS. 5A, 5B, 6, 7, 9, 10, 12, 13 and 14 are based on a waveguide 40 such as shown in FIG. 4A, but they could also be based on a waveguide 40' such as shown in FIG. 4B, by inserting intermediate layers 43 and 45 respectively between the layers 42, 44 and 44, 46.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An optical phase shifter comprising a photonic waveguide for conducting light having a first wavelength and light having a second wavelength, the waveguide comprising superposed first and second strips of light conducting semiconductor materials having first and second refractive indexes, wherein the second wavelength is shorter than the first wavelength and the second refractive index is higher than the first refractive index, wherein the width and height of the first strip of light conducting semiconductor material are such that the first strip of light conducting semiconductor material is adapted to support an optical mode of the first wavelength by said first strip of light conducting semiconductor material and the width and height of the second strip of light conducting semiconductor material are such that the second strip of light conducting semiconductor material is adapted to support an optical mode of the second wavelength by said second strip of light conducting semiconductor material but is too narrow to support an optical mode of the first wavelength by said second strip of light conducting semiconductor material; wherein:
the first and second strips of light conducting semiconductor materials comprise each a layer of thermo-optic material;
the phase shifter further comprising first and second temperature control elements arranged for controllably changing the temperature of the thermo-optic material of the first and second strips of light conducting semiconductor materials.

2. The optical phase shifter of claim 1, comprising between the first and second strips of light conducting semiconductor materials an intermediate strip of light conducting semiconductor material having a refractive index comprised between the first and second refractive indexes, and having a width and a height such that the intermediate strip of light conducting semiconductor material is too narrow to support an optical mode of the first wavelength.

3. An optical input waveguide, having an input section for receiving light having the first and second wavelengths and having an output section coupled to an optical phase shifter of claim 1, the optical input waveguide comprising superposed first and second strips of light conducting semiconductor materials of the same materials as the photonic waveguide; wherein:
in the input section, the width and height of the second strip of light conducting semiconductor material are such that the second strip of light conducting semiconductor material is adapted to support an optical mode of the first wavelength as well as an optical mode of the second wavelength;
in the output section, the width and height of the superposed first and second strips of light conducting semiconductor materials are the same as those of the superposed first and second strips of light conducting semiconductor materials of the photonic waveguide;
wherein the width and height of the second strip of light conducting semiconductor material change gradually from the input section to the output section of the optical input waveguide.

4. An optical emitter abutting and optically coupled to a section of an optical phase shifter according to claim 1; wherein:
the second strip of light conducting semiconductor material of the photonic waveguide section extends into the optical emitter and has a length and an emitter end surface perpendicular to said length; and
the first strip of light conducting semiconductor material of the photonic waveguide section extends into the optical emitter and has a bottom surface and a slanted end surface extending between said bottom surface and a bottom edge of the emitter end surface;
wherein said slanted end surface, as well as the side surfaces of the first and second strips, are covered with a metal layer.

5. An optical emitter abutting and optically coupled to a section of an optical phase shifter according to claim 1; the optical emitter comprising superposed first and second strips of light conducting semiconductor materials of the same materials as the photonic waveguide, and having an input section, an inner section and an output section wherein:
in the input section, the width and height of the superposed first and second strips of light conducting semiconductor materials are the same as those of the superposed first and second strips of light conducting semiconductor materials of the photonic waveguide to which it is coupled;
in the inner section, the width of the second strip of light conducting semiconductor material is such that the second strip of light conducting semiconductor material is adapted to support an optical mode of the first wavelength as well as an optical mode of the second wavelength; and in the inner section, the width of the first strip of light conducting semiconductor material is such that the first strip of light conducting semiconductor material is too narrow to support an optical mode of either the first or the second wavelengths; wherein the widths of the first and second strips of light conducting semiconductor material change gradually from the input section to the inner section of the optical emitter; and wherein in the output section, the second strip of light conducting material ends, forming an emitter end surface normal to the length of the second strip of light conducting material, the width and height of the emitter end surface being too narrow to support an optical mode of either the first or the second wavelengths; wherein the width and height of the second strip of light conducting semiconductor material change gradually from the inner section of the optical emitter to the emitter end.

6. The optical emitter of claim 5, wherein the optical emitter is arranged between top, bottom and lateral metallic walls forming a truncated pyramid, wherein said emitter end surface form the truncated end of the pyramid, wherein in the output section, at least the sides of the second strip of light conducting material follow the lateral metallic walls.

7. The optical phase shifter of claim 1, wherein each temperature control element comprises a resistor capable of producing heat, the optical phase shifter comprising a heat conductor capable of evacuating heat.

8. The optical phase shifter of claim 1, comprising between the first and second strips of light conducting semiconductor materials an intermediate strip of light conducting semiconductor material having a refractive index comprised between the first and second refractive indexes, the intermediate strip of light conducting material having a thermal conductivity that is lower than the thermal conductivity of the materials comprising the first and second strips.

9. The optical phase shifter of claim 8, wherein the width and height of the intermediate strip of light conducting semiconductor material are such that the intermediate strip of light conducting semiconductor material is too narrow to support an optical mode of the first wavelength.

10. An optical coupler comprising first and second photonic waveguides for conducting each light having a first wavelength and light having a second wavelength;

each of the first and second photonic waveguides comprising superposed first and second strips of light conducting semiconductor materials having first and second refractive indexes, wherein the second wavelength is shorter than the first wavelength and the second refractive index is higher than the first refractive index, wherein the width and height of the first strip of light conducting semiconductor material are such that the first strip of light conducting semiconductor material is adapted to support an optical mode of the first wavelength by said first strip of light conducting semiconductor material and the width and height of the second strip of light conducting semiconductor material are such that the second strip of light conducting semiconductor material is adapted to support an optical mode of the second wavelength by said second strip of light conducting semiconductor material but is too narrow to support an optical mode of the first wavelength by said second strip of light conducting semiconductor material; wherein end portions of the first strip of light conducting semiconductor materials of the first and second photonic waveguides join laterally to form respectively first and second sides of a first end of a first strip of light conducting semiconductor material of a coupling portion;

corresponding end portions of the second strip of light conducting semiconductor materials of the first and second photonic waveguides join laterally to form respectively first and second sides of a first end of a second strip of light conducting semiconductor material of the coupling portion;

wherein the first and second strips of light conducting semiconductor materials of the coupling portion respectively comprise first and second layers of thermo-optic materials;

the optical coupler further comprising:

first and second temperature control elements arranged for controllably changing the temperature of respectively the first and second sides of the first layer of thermo-optic material of the coupling portion; and third and fourth temperature control elements arranged for controllably changing the temperature of respectively the first and second sides of the second layer of thermo-optic material of the coupling portion.

11. The optical coupler of claim 10, further comprising third and fourth photonic waveguides according to claim 1, wherein:

end portions of the first strip of light conducting semiconductor material of the third and fourth photonic waveguides join laterally to form respectively the first and second sides of a second end of the first strip of the coupling portion; and corresponding end portions of the second strip of light conducting semiconductor material of the third and fourth photonic waveguides join laterally to form the first and second sides of a second end of the second strip of the coupling portion.

12. The optical coupler of claim 10, wherein the width and height of the first strip of light conducting semiconductor material of the coupling portion are such that the first strip of light conducting semiconductor material of the coupling portion can support two-wave-guided modes of the first wavelength and the width and height of the second strip of light conducting semiconductor material of the coupling portion are such that the second strip of light conducting semiconductor material of the coupling portion can support two-wave-guided modes of the second wavelength.

13. The optical coupler of claim 10, comprising a light absorber coupled to one of the first, second, third and fourth photonic waveguides.

14. The optical coupler of claim 10, wherein each temperature control element comprises a resistor capable of producing heat and the optical coupler further comprises a heat conductor capable of evacuating heat.

15. The optical coupler of claim 10 comprising, between the first and second sides of each strip of light conducting semiconductor material of the coupling portion, an insulating region that allows light in the first side of the strip of light conducting semiconductor material of the coupling portion to couple with light in the second side of the strip of light conducting semiconductor material of the coupling portion and reciprocally while reducing heat coupling between the first and second sides of the coupling portion.

16. The optical coupler of claim 10, comprising between the first and second strips of light conducting semiconductor materials of the coupling portion an intermediate strip of light conducting semiconductor material having a refractive index comprised between the first and second refractive indexes, the intermediate strip of light conducting material having a thermal conductivity that is lower than the thermal conductivity of the materials comprising the first and second strips.

17. A two-dimensional optical phased array comprising a plurality of mono-dimensional optical phased arrays arranged in a stack, the second sides of the substrates of the plurality of mono-dimensional optical phased array forming an emitter side surface of the stack;
wherein each of the plurality of mono-dimensional optical phased array comprises at least first and second photonic waveguides, each for conducting light having a first wavelength and light having a second wavelength;
each of the first and second photonic waveguides comprising superposed first and second strips of light conducting semiconductor materials having first and second refractive indexes, wherein the second wavelength is shorter than the first wavelength and the second refractive index is higher than the first refractive index, wherein the width and height of the first strip of light conducting semiconductor material are such that the first strip of light conducting semiconductor material is adapted to support an optical mode of the first wavelength in said first strip of light conducting semiconductor material and the width and height of the second strip of light conducting semiconductor material are such that the second strip of light conducting semiconductor material is adapted to support an optical mode of the second wavelength in said second strip of light conducting semiconductor material but is too narrow to support an optical mode of the first wavelength in said second strip of light conducting semiconductor material;
wherein each of the plurality of mono-dimensional optical phased array has a thickness selected such that the optical emitters of the different mono-dimensional optical phased arrays are separated by pseudo-random distances.

18. The two-dimensional optical phased array of claim 17, wherein each mono-dimensional optical phased array has a number of optical emitters that is more than twice the number of mono-dimensional optical phased arrays.

19. The two-dimensional optical phased array of claim 18, wherein the density of optical emitters is larger toward the center of the emitter side surface of the stack than toward the edges of the emitter side surface of the stack.

20. The optical coupler of claim 10, comprising an optical phase shifter of claim 1 coupled to one of the first and second photonic waveguides.

21. A photonic waveguide for conducting light having a first wavelength and light having a second wavelength, the waveguide comprising superposed first and second strips of light conducting semiconductor materials having first and second refractive indexes, wherein the second refractive index is higher than the first refractive index, wherein the width and height of the first strip of light conducting semiconductor material are such that the first strip of light conducting semiconductor material is adapted to support an optical mode of the first wavelength in said first strip of light conducting semiconductor material and the width and height of the second strip of light conducting semiconductor material are such that the second strip of light conducting semiconductor material is adapted to support an optical mode of the second wavelength in said second strip of light conducting semiconductor material but is not wide enough to support an optical mode of the first wavelength in said second strip of light conducting semiconductor material.

22. The photonic waveguide of claim 21, wherein:
the second wavelength is comprised in the SWIR band and the first wavelength is comprised in one of the MWIR1, MWIR2 and LWIR bands; or
the second wavelength is comprised in the MWIR1 band and the first wavelength is comprised in one of the MWIR2 and LWIR bands; or
the second wavelength is comprised in the MWIR2 band and the first wavelength is comprised in the LWIR bands.

23. The photonic waveguide of claim 21, wherein the width of the second strip of light conducting semiconductor material is smaller than the width of the first strip of light conducting semiconductor material.

24. The photonic waveguide of claim 21, wherein the height of the second strip of light conducting semiconductor material is smaller than the height of the first strip of light conducting semiconductor material.

25. The two-dimensional optical phased array of claim 17, wherein each of the plurality of mono-dimensional optical phased array comprises at least an optical coupler comprising said first and second photonic waveguides; wherein
end portions of the first strip of light conducting semiconductor materials of the first and second photonic waveguides join laterally to form respectively first and second sides of a first end of a first strip of light conducting semiconductor material of a coupling portion;
corresponding end portions of the second strip of light conducting semiconductor materials of the first and second photonic waveguides join laterally to form respectively first and second sides of a first end of a second strip of light conducting semiconductor material of the coupling portion;
wherein the first and second strips of light conducting semiconductor materials of the coupling portion respectively comprise first and second layers of thermo-optic materials;
the optical coupler further comprising:
first and second temperature control elements arranged for controllably changing the temperature of respectively the first and second sides of the first layer of thermo-optic material of the coupling portion; and
third and fourth temperature control elements arranged for controllably changing the temperature of respectively the first and second sides of the second layer of thermo-optic material of the coupling portion.

* * * * *